United States Patent
Kimura et al.

(10) Patent No.: US 12,408,452 B2
(45) Date of Patent: Sep. 2, 2025

(54) SOLID-STATE IMAGE PICKUP APPARATUS AND MANUFACTURING METHOD THEREFOR, AND ELECTRONIC EQUIPMENT

(71) Applicant: SONY SEMICONDUCTOR SOLUTIONS CORPORATION, Kanagawa (JP)

(72) Inventors: Tadayuki Kimura, Kanagawa (JP); Takatoshi Kameshima, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 922 days.

(21) Appl. No.: 17/435,090

(22) PCT Filed: Jan. 30, 2020

(86) PCT No.: PCT/JP2020/003434
§ 371 (c)(1),
(2) Date: Aug. 31, 2021

(87) PCT Pub. No.: WO2020/183965
PCT Pub. Date: Sep. 17, 2020

(65) Prior Publication Data
US 2022/0139975 A1    May 5, 2022

(30) Foreign Application Priority Data
Mar. 14, 2019 (JP) .................................. 2019-047653

(51) Int. Cl.
*H10F 39/00* (2025.01)
*H01L 21/02* (2006.01)
(Continued)

(52) U.S. Cl.
CPC .......... *H10F 39/802* (2025.01); *H10B 61/00* (2023.02); *H10F 39/8053* (2025.01); *H10F 39/806* (2025.01); *H10N 50/85* (2023.02)

(58) Field of Classification Search
CPC ...... H10B 61/00; H10F 39/802; H10F 39/806
See application file for complete search history.

(56) References Cited

U.S. PATENT DOCUMENTS

| | | |
|---|---|---|
| 2012/0211849 A1 | 8/2012 | Matsugai |
| 2014/0070162 A1* | 3/2014 | Iwayama ............. H10N 70/826 257/4 |

(Continued)

FOREIGN PATENT DOCUMENTS

| | | |
|---|---|---|
| EP | 3540776 A2 | 9/2019 |
| JP | 2012-059805 A | 3/2012 |

(Continued)

OTHER PUBLICATIONS

International Search Report and Written Opinion of PCT Application No. PCT/JP2020/003434, issued on Apr. 14, 2020, 12 pages of ISRWO.

*Primary Examiner* — Antonio B Crite
(74) *Attorney, Agent, or Firm* — CHIP LAW GROUP

(57) ABSTRACT

A solid-state image pickup apparatus includes a first structure having a first substrate, and a pixel region including a plurality of pixels which is formed in the first substrate, outputs pixel signals according to amounts of electric charges generated by photoelectric conversion, and is arrayed in a two-dimensional grid, and a second structure that is stacked on the first structure, and has a second substrate, and a logic circuit and a non-volatile memory that are formed in the second substrate, in which a first protective film having a property of inhibiting entrance of hydrogen is formed on an end surface of a storage element included in the non-volatile memory which end surface is on a side (Continued)

facing the first structure, and a second protective film having the property of inhibiting entrance of hydrogen is formed on a side surface of the storage element.

20 Claims, 21 Drawing Sheets

(51) Int. Cl.
*H01L 21/3205* (2006.01)
*H01L 21/768* (2006.01)
*H01L 23/522* (2006.01)
*H01L 25/065* (2023.01)
*H01L 25/07* (2006.01)
*H01L 25/18* (2023.01)
*H10B 61/00* (2023.01)
*H10N 50/01* (2023.01)
*H10N 50/10* (2023.01)
*H10N 50/85* (2023.01)

(56) References Cited

U.S. PATENT DOCUMENTS

| | | | |
|---|---|---|---|
| 2016/0284753 A1 | 9/2016 | Komai et al. | |
| 2017/0154873 A1 | 6/2017 | Kim et al. | |
| 2019/0363130 A1 | 11/2019 | Yokoyama et al. | |

FOREIGN PATENT DOCUMENTS

| | | | | |
|---|---|---|---|---|
| JP | 2012-174937 A | 9/2012 | | |
| JP | 2014-056941 A | 3/2014 | | |
| JP | 2015-065407 A | 4/2015 | | |
| JP | 2018-101800 A | 6/2018 | | |
| JP | 2018-129374 A | 8/2018 | | |
| JP | 2018-182038 A | 11/2018 | | |
| WO | 2015/093017 A1 | 6/2015 | | |
| WO | WO-2018004652 A1 * | 1/2018 | | |
| WO | WO-2018146984 A1 * | 8/2018 | ........... | H01L 23/552 |
| WO | 2018/189994 A1 | 10/2018 | | |

* cited by examiner

SOLID-STATE IMAGE PICKUP APPARATUS AND MANUFACTURING METHOD THEREFOR, AND ELECTRONIC EQUIPMENT

CROSS REFERENCE TO RELATED APPLICATIONS

This application is a U.S. National Phase of International Patent Application No. PCT/JP2020/003434 filed on Jan. 30, 2020, which claims priority benefit of Japanese Patent Application No. JP 2019-047653 filed in the Japan Patent Office on Mar. 14, 2019. Each of the above-referenced applications is hereby incorporated herein by reference in its entirety.

TECHNICAL FIELD

The present disclosure relates to a solid-state image pickup apparatus and a manufacturing method therefor, and electronic equipment.

BACKGROUND ART

In recent years, studies have been carried out about a 3D stacked integrated circuit that is included in one system formed by joining, and stacking two or more semiconductor substrates one on another.

For example, regarding a solid-state image pickup apparatus, for the purpose of enhancing memory functions, studies have been carried out about a 3D stacked integrated circuit formed by stacking a substrate in which a pixel region (pixel array) is formed, and a substrate formed of a non-volatile memory and logic circuit in a mixed manner, the logic circuit performing signal processing related to operation of the solid-state image pickup apparatus (see PTL 1, for example).

In addition, in recent years, a magneto-resistive random access memory (MRAM: Magneto-resistive RAM), a ferroelectric memory (FeRAM: Ferroelectric RAM), a phase change memory (PRAM: Phase-change RAM), a resistive random access memory (ReRAM: Resistive RAM), and the like are attracting attention as non-volatile memories.

Particularly, a magneto-resistive random access memory is a memory that uses the tunnel magneto-resistive effect of a magnetic tunnel junction (MTJ: Magnetic Tunnel Junction) element, and it is considered that an STT-MRAM that adopts an STT (Spin Transfer Torque) writing method is advantageous for realizing higher density, lower power consumption, and less leakage. Accordingly, application to a solid-state image pickup apparatus that handles a large amount of pixel data has been examined.

However, there is a problem regarding a storage element such as an MTJ element included in a non-volatile memory that the storage element is influenced by activated hydrogen or the like that is generated from an interlayer dielectric film included in a stacked solid-state image pickup apparatus at a BEOL (Back End Of Line) step, a joining step, and steps after the joining step, and a property of the storage element deteriorate.

In contrast, there is a disclosed structure in which the side wall of a storage element is protected by a protective film having an insulating property in order to protect the storage element from activated hydrogen or the like (see PTL 2, for example).

CITATION LIST

Patent Literature

[PTL 1]
JP 2015-65407A
[PTL 2]
JP 2012-59805A

SUMMARY

Technical Problem

Meanwhile, in a stacked configuration having an interlayer dielectric film in which an oxide film having a high hydrogen content, and a nitride film that is superior in moisture resistance are stacked adjacent to each other near a junction region, a high temperature steam cross link phenomenon occurs in a case that a high temperature process under 350° C. to 400° C. is performed at a joining step. Due to the high temperature steam cross link phenomenon, activated hydrogen is generated. This activated hydrogen passes also through metals such as aluminum, copper, or tungsten, and accordingly, protection of only the side wall as in the conventional technology described above is insufficient for preventing hydrogen from entering a storage element.

The present disclosure has been made in view of such a circumstance, and an object of the present disclosure is to provide a solid-state image pickup apparatus, electronic equipment, and a solid-state image pickup apparatus manufacturing method that make it possible to protect a storage element against entrance of hydrogen not only from the side surface of the storage element, but also from an end surface thereof on a side closer to a junction surface.

Solution to Problem

A first aspect of the present disclosure is a solid-state image pickup apparatus including: a first structure having a first substrate, and a pixel region including a plurality of pixels which is formed in the first substrate, outputs pixel signals according to amounts of electric charges generated by photoelectric conversion, and is arrayed in a two-dimensional grid; and a second structure which is stacked on the first structure, and has a second substrate, and a logic circuit and a non-volatile memory that are formed in the second substrate, in which a first protective film having a property of inhibiting entrance of hydrogen is formed on an end surface of a storage element included in the non-volatile memory which end surface is on a side facing the first structure, and a second protective film having the property of inhibiting entrance of hydrogen is formed on a side surface of the storage element, or electronic equipment including the solid-state image pickup apparatus.

In addition, a second aspect according to the present technology is a solid-state image pickup apparatus manufacturing method including: a step of configuring a first structure by forming a pixel region in a first substrate, the pixel region having a plurality of pixels that is arrayed in a two-dimensional grid; a step of configuring a second structure by forming a logic circuit and a non-volatile memory in a second substrate; and a step of stacking the first structure and the second structure one on another, in which in the step of configuring the second structure, a first protective film having a property of inhibiting entrance of hydrogen is formed on an end surface of a storage element included in the non-volatile memory which end surface is on a side to face the first structure, and a second protective film having the property of inhibiting entrance of hydrogen is formed on a side surface of the storage element.

According to the solid-state image pickup apparatus and the electronic equipment of the present disclosure, the first protective film provided on the end surface of the storage element on the junction surface side, and the second protective film provided on the side surface of the storage element can prevent entrance of atoms and molecules such as hydrogen that have a negative influence on the storage element also from the end surface on the junction surface side, in addition to entrance from the side surface.

DESCRIPTION OF EMBODIMENTS

Figure 1:
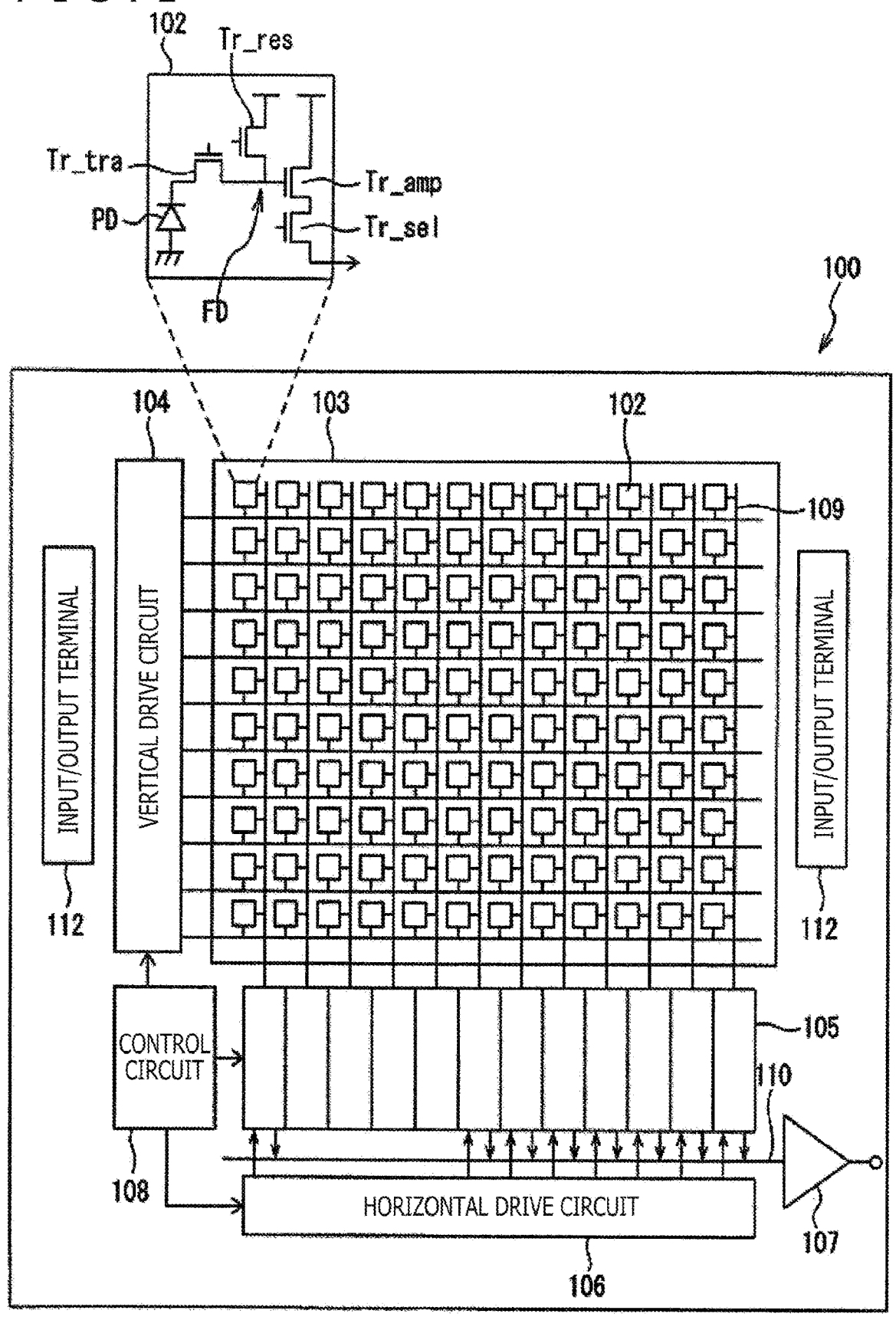
FIG. 1 is a figure depicting a configuration example of a solid-state image pickup apparatus according to an embodiment of the present disclosure.

In the following, embodiments of the present disclosure are explained with reference to the figures. In the descriptions of the figures that are referred to in the following explanation, identical or similar portions are given identical or similar reference characters. It should be noted however that the figures are schematic figures, and the relations between thicknesses, and plane dimensions, the rate of the thickness of each layer, and the like are different from actual ones. Accordingly, specific thicknesses, and dimensions should be determined by taking the following explanation into consideration. In addition, obviously, dimensions depicted also in different figures may have different relations, and rates in some cases.

In addition, definitions of directions such as the vertical direction in the following explanation are definitions that are used simply for convenience of explanation, and do not limit the technical idea of the present disclosure. For example, obviously, if a target object is observed after being rotated 90°, the vertical direction mentioned in an explanation of the target object is interpreted as meaning the lateral direction, and if the target object is observed after being rotated 180°, the vertical direction mentioned in the explanation is interpreted as meaning an inverted direction.

FIG. 1 is a figure depicting a configuration example of a solid-state image pickup apparatus according to an embodiment of the present disclosure. This solid-state image pickup apparatus 100 is a CMOS solid-state image pickup apparatus, for example. As depicted in FIG. 1, the solid-state image pickup apparatus 100 includes: a pixel region 103 including pixels 102 that include a plurality of photoelectric converting sections and that are arrayed regularly in a two-dimensional grid; and a peripheral circuit section. The pixel region 103 may be referred to as a pixel array 103. The pixels 102 have the photoelectric converting sections, and a plurality of pixel transistors. For example, the photoelectric converting sections include photodiodes PD. The pixel transistors have transfer transistors Tr_tra, reset transistors Tr_res, amplification transistors Tr_amp, and selection transistors Tr_sel. Each of the transfer transistors Tr_tra, the reset transistors Tr_res, the amplification transistors Tr_amp, and the selection transistors Tr_sel includes a MOS transistor.

The photodiodes PD have regions where photoelectric conversion occurs when light enters there and signal charge generated by the photoelectric conversion is accumulated. The transfer transistors Tr_tra are transistors that read out the signal charge accumulated in the photodiodes PD to floating diffusion (FD) regions. The reset transistors Tr_res are transistors for setting the potential of the floating diffusion (FD) regions to specified values. The amplification transistors Tr_amp are transistors for electrically amplifying the signal charge read out to the floating diffusion (FD) regions. The selection transistors Tr_sel are transistors for reading out pixel signals of one selected line of pixels to a vertical signal line 109. Note that, although not depicted in figures, the selection transistors Tr_sel may be omitted, and each pixel can include three transistors, and a photodiode PD.

In the circuit configuration of each pixel 102, the source of a transfer transistor Tr_tra is connected to a photodiode PD, and the drain of the transfer transistor Tr_tra is connected to the source of a reset transistor Tr_res. A floating diffusion region FD (corresponding to the drain region of the transfer transistor, and the source region of the reset transistor) to function as charge-voltage converting means between the transfer transistor Tr_tra, and the reset transistor Tr_res is connected to the gate of an amplification transistor Tr_amp. The source of the amplification transistor Tr_amp is connected to the drain of a selection transistor Tr_sel. The drain of the reset transistor Tr_res and the drain of the amplification transistor Tr_amp are connected to a power source voltage supply section. In addition, the source of the selection transistor Tr_sel is connected to a vertical signal line 109.

The peripheral circuit section has a vertical drive circuit 104, column signal processing circuits 105, a horizontal drive circuit 106, an output circuit 107, and a control circuit 108. The control circuit 108 generates control signals, and clock signals to function as reference signals for operation by the vertical drive circuit 104, the column signal processing circuits 105, the horizontal drive circuit 106, and the like. Then, the control circuit 108 inputs those signals to the vertical drive circuit 104, the column signal processing circuits 105, the horizontal drive circuit 106, and the like.

The vertical drive circuit 104 includes a shift register, for example. The vertical drive circuit 104 selects, and scans each line of the pixels 102 in the pixel region 103 sequentially, and vertically. Then, the vertical drive circuit 104 supplies a column signal processing circuit 105, through the vertical signal line 109, with a pixel signal based on signal charge generated in each pixel 102 according to a light reception amount.

For example, the vertical drive circuit 104 is connected to the gates of the transfer transistors Tr_tra, the gates of the reset transistors Tr_res, and the gates of the selection transistors Tr_sel via wires. By applying a signal to each gate of the transfer transistors Tr_tra, the reset transistors Tr_res, and the selection transistors Tr_sel via the wires, the vertical drive circuit 104 can turn on, or turn off each gate.

Operation at each pixel 102 is performed in the following procedure. First, the vertical drive circuit 104 turns on the gate of the transfer transistor Tr_tra, and the gate of the reset transistor Tr_res, and empties the entire electric charges of the photodiode PD. Next, the vertical drive circuit 104 turns off the gate of the transfer transistor Tr_tra, and the gate of the reset transistor Tr_res, and performs charge accumulation. Next, the vertical drive circuit 104 turns on the gate of the reset transistor Tr_res immediately before reading out the electric charges of the photodiode PD, and resets the potential of the floating diffusion region FD. Thereafter, the vertical drive circuit 104 turns off the gate of the reset transistor Tr_res, turns on the gate of the transfer transistor Tr_tra, and transfers the electric charges from the photodiode PD to the floating diffusion region FD. Upon reception of the application of the electric charges at its gate, the amplification transistor Tr_amp electrically amplifies the signal charge. The vertical drive circuit 104 turns on the gate of the selection transistor Tr_sel, and outputs an image signal charge-voltage converted at the amplification transistor Tr_amp to the vertical signal line 109.

Each column signal processing circuits 105 is arranged for a column of pixels 102. The column signal processing circuits 105 perform a process of removing fixed pattern noise unique to the pixels 102, and signal processing such as signal amplification or AD conversion. The output stages of the column signal processing circuits 105 are connected to a horizontal signal line 110 via a horizontal selection switch (not depicted in figures). The horizontal drive circuit 106 includes a shift register, for example. The horizontal drive circuit 106 sequentially selects each of the column signal processing circuits 105, and causes each of the column signal processing circuits 105 to output a pixel signal to the horizontal signal line 110.

The output circuit 107 performs signal processing on a signal that is sequentially supplied from each of the column signal processing circuits 105 through the horizontal signal line 110, and outputs the signal. For example, the output circuit 107 performs only buffering in some cases, and performs black level adjustment, column-by-column variation correction, various types of digital signal processing, and the like in some other cases. Input/output terminals 112 exchange signals with the outside.

Figure 2:
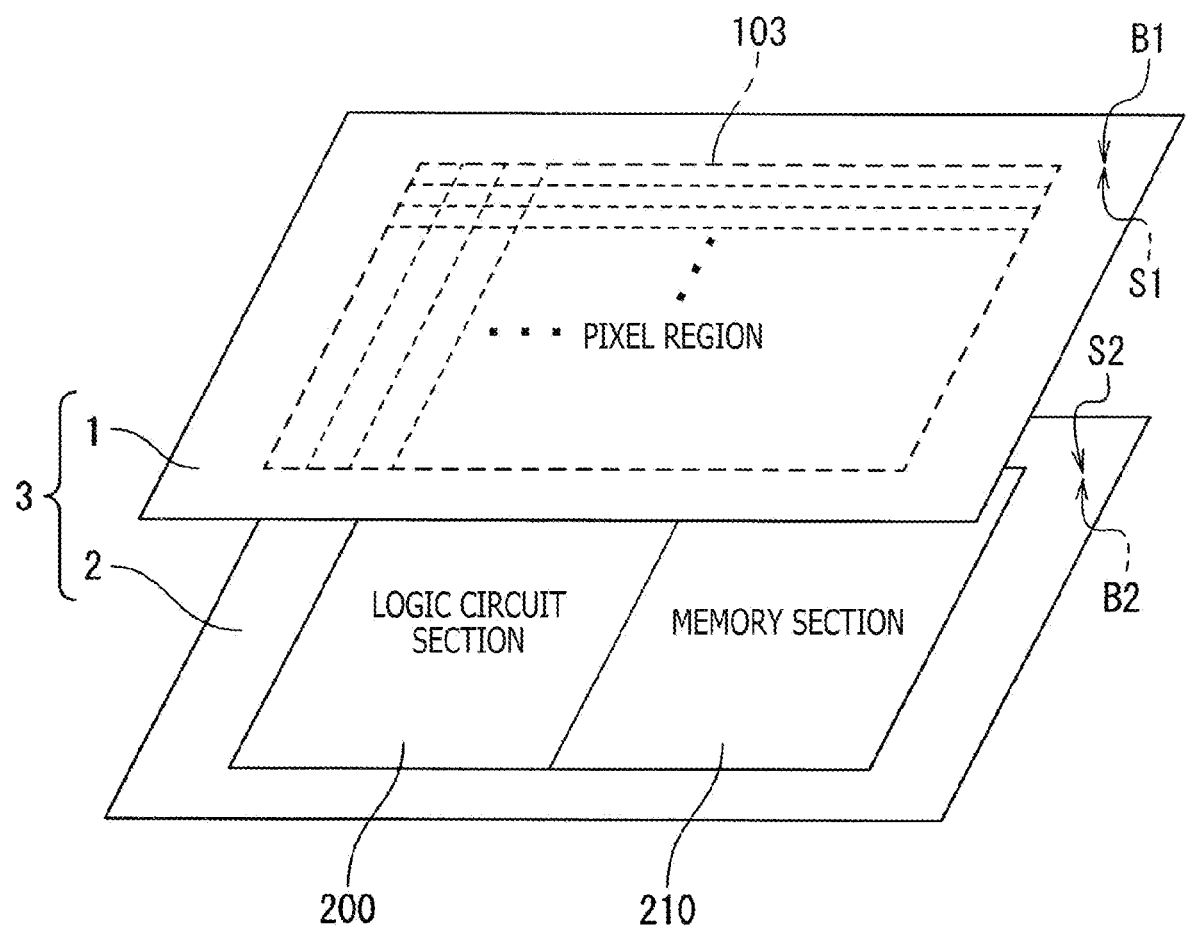
FIG. 2 is a schematic diagram depicting a configuration example of the solid-state image pickup apparatus according to the embodiment of the present disclosure.

FIG. 2 is a schematic diagram depicting a configuration example of the solid-state image pickup apparatus 100 according to the embodiment of the present disclosure. As depicted in FIG. 2, the solid-state image pickup apparatus 100 includes a pixel chip 1, and a logic memory chip 2 (hereinafter, referred to as an "L/M chip 2") stacked on the pixel chip 1.

On a side of the pixel chip 1 where there is a first main surface S1 which is one surface of the pixel chip 1, the pixel region 103 having the plurality of pixels 102 is provided. In addition, although not depicted in figures, on a side where there is a first back surface B1, color filters, and microlenses corresponding to the pixels 102 are provided.

On a side of the L/M chip 2 where there is a second main surface S2 which is one surface of the L/M chip 2, a logic circuit section 200 having a logic circuit that executes various types of signal processing related to operation of the solid-state image pickup apparatus 100, and a memory section 210 having a non-volatile memory are provided.

The logic circuit section 200 includes, as logic circuits, any one or more of the vertical drive circuit 104, the column signal processing circuits 105, the horizontal drive circuit 106, the output circuit 107, and the control circuit 108 depicted in FIG. 1, for example. Note that, in the present embodiment, some of the logic circuits may be provided not only in the L/M chip 2, but also in the pixel chip 1. For example, at least some of the vertical drive circuit 104, the column signal processing circuits 105, and the control circuit 108 may be provided in the pixel chip 1.

In addition, while there are non-volatile memories like magneto-resistive random access memories, ferroelectric memories, phase change memories, resistive random access memories, and the like, for example, it is assumed that the memory section 210 according to the present embodiment includes a magneto-resistive random access memory.

Here, the pixel chip 1 corresponds to the first structure described in claims, and the L/M chip 2 corresponds to the second structure described in claims.

The pixel chip 1 and the L/M chip 2 are joined such that the first main surface S1 which is a surface on a side of the pixel chip 1 where the pixel region 103 is formed is joined to the second main surface S2 which is a surface on a side of the L/M chip 2 where the logic circuit section 200, and the memory section 210 are formed, via an interlayer dielectric film. In this manner, the pixel chip 1 and the L/M chip 2 are stacked one on another by being joined on the sides of their main surfaces. Thereby, a joining portion C is formed. This joining method is generally called Face to Face joining. In addition, in the present embodiment, a structure obtained by bonding the pixel chip 1 and the L/M chip 2 is referred to as a stacked chip 3.

Note that, while a configuration in which the main surfaces of the pixel chip 1 and the L/M chip 2 are joined to stack the pixel chip 1 and the L/M chip 2 one on another is mentioned in the example in FIG. 2, this configuration is not the sole example, and the first main surface S1 of the pixel chip 1 and a second back surface B2 of the L/M chip 2 may be joined to stack the pixel chip 1 and the L/M chip 2 one on another, in an alternative configuration.

In addition, while a configuration in which two layers which are the pixel chip 1 and the L/M chip 2 are stacked one on another is mentioned, this configuration is not the sole example, and a stacked configuration including three or more layers may be adopted. For example, three layers which are the pixel chip 1, a logic chip in which only the logic circuit section 200 is provided, and a memory chip in which only the memory section 210 is provided may be stacked one on another, and so on, in an alternative configuration.

Figure 3:
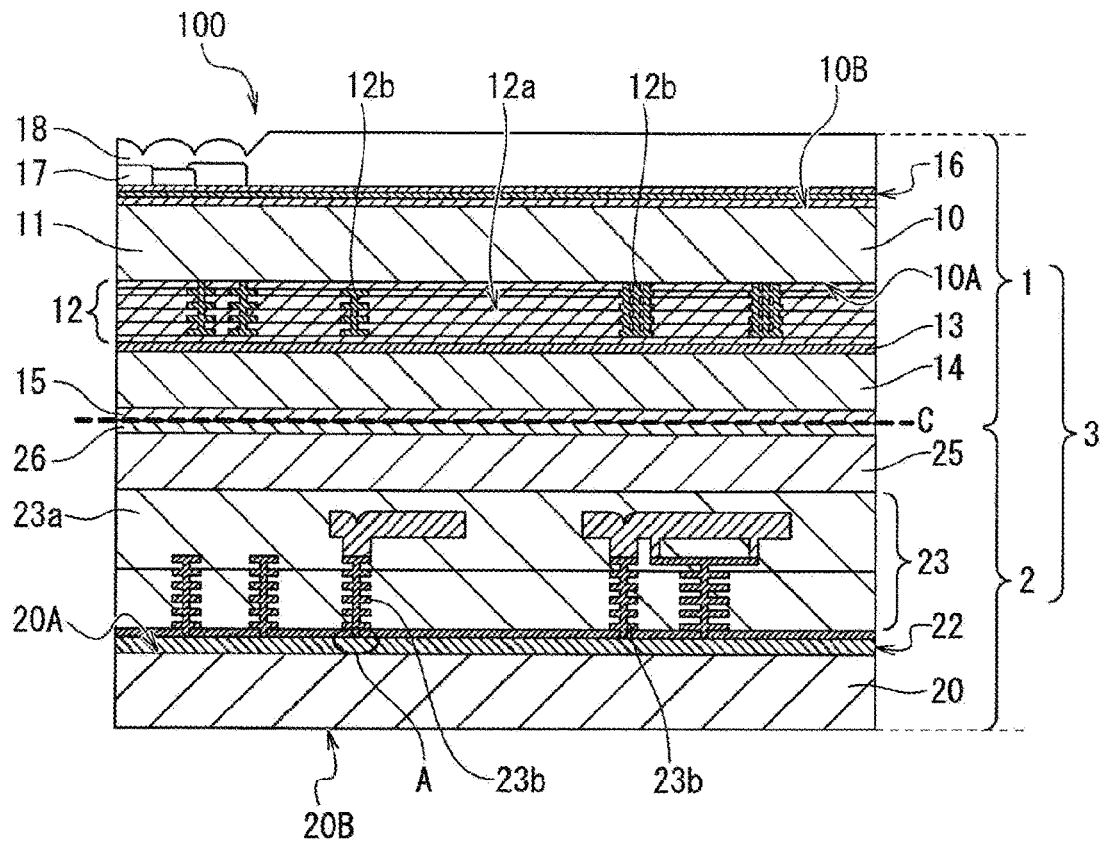
FIG. 3 is a cross-sectional view depicting a configuration example of the solid-state image pickup apparatus according to the embodiment of the present disclosure.

The solid-state image pickup apparatus 100 depicted in FIG. 3 is a back-illuminated CMOS solid-state image pickup apparatus, for example. As depicted in FIG. 3, the solid-state image pickup apparatus 100 includes the pixel chip 1 having the pixel region 103, and the L/M chip 2 having the logic circuit section 200 and the memory section 210. The first main surface S1 of the pixel chip 1 is pasted onto the second main surface S2 of the L/M chip 2 to form the stacked chip 3.

The pixel chip 1 includes a first semiconductor substrate 10. The first semiconductor substrate 10 includes silicon. The first semiconductor substrate 10 is provided with a well region 11, a plurality of photodiodes to function as photoelectric converting sections, and a plurality of pixel transistors, and some of these are not depicted in figures. As depicted in FIG. 1, the pixel transistors have transfer transistors Tr_tra, reset transistors Tr_res, amplification transistors Tr_amp, and selection transistors Tr_sel. The photodiodes and the pixel transistors are provided in the well region 11. Although not depicted in figures, a plurality of MOS transistors included as a part of the logic circuit section 200 may be provided in the first semiconductor substrate 10.

On a front surface (lower surface in FIG. 3) 10A side of the first semiconductor substrate 10, a multilayer wiring layer 12 is provided. The multilayer wiring layer 12 has an interlayer dielectric film 12*a*, and a plurality of multilayer wires 12*b* that is arranged one on another in a plurality of layers via the interlayer dielectric film 12*a*. That is, adjacent ones of the plurality of multilayer wires 12*b* are insulated from each other by the interlayer dielectric film 12*a*.

The multilayer wires 12*b* include copper (Cu) or gold (Au), for example. The multilayer wires 12*b* are formed by the single damascene method or the dual damascene method.

On a back surface (top surface in FIG. 3) 10B side of the first semiconductor substrate 10, a flattening layer 16 is provided. Although not depicted in figures, the flattening layer 16 has an insulating film, a light-blocking film provided via the insulating film, and a flattening film provided on the insulating film. The light-blocking film is covered with the flattening film. Color filter layers 17 and microlenses 18 are provided on the flattening layer 16.

Although not depicted in figures, gate electrodes are provided via a gate insulating film on the front surface 10A side of the first semiconductor substrate 10. The gate insulating film, the gate electrodes, and source/drain regions are included in the pixel transistors. Each unit pixel is separated by an element separation region (not depicted in figures) with an STI (Shallow Trench Isolation) structure, for example. Each photodiode includes an n-type semiconductor region and a p-type semiconductor region, for example.

Furthermore, an interlayer dielectric film 13 is provided on the multilayer wiring layer 12, and an interlayer dielectric film 14 for adjusting warping of the pixel chip 1 is provided on the interlayer dielectric film 13. An interlayer dielectric film 15 for joining is provided on the interlayer dielectric film 14.

Conductive vias electrically connect the pixel transistors and the multilayer wires 12*b*, and connect vertically adjacent wiring sections. In addition, some wiring sections in a plurality of wiring sections included in the multilayer wires 12*b* are electrically connected with electrodes. The electrodes are configured to electrically connect the pixel transistors of the pixel chip 1, and the logic circuit section 200, and the memory section 210 of the L/M chip 2. Examples of the electrodes include, for example, through electrodes such as TSVs (Through Silicon Vias), metal electrodes used for direct joining of chips such as Cu—Cu (copper-copper) joining, and the like.

The L/M chip 2 includes a second semiconductor substrate 20. The second semiconductor substrate 20 includes silicon. A front surface (the top surface in FIG. 3) 20A side of the second semiconductor substrate 20 is provided with a logic memory mixed layer (hereinafter, referred to as an "L/M mixed layer") 22 having the logic circuit section 200 and the memory section 210 formed thereon. The L/M mixed layer 22 has transistors, storage elements 8, electrodes, and the like (not depicted in FIG. 3) included in the logic circuit section 200 and the memory section 210. A multilayer wiring layer 23 is provided on the L/M mixed layer 22. The multilayer wiring layer 23 has an interlayer dielectric film 23*a* and a plurality of multilayer wires 23*b* arranged on a plurality of layers via the interlayer dielectric film 23*a*. An interlayer dielectric film 25 for warp adjustment of the L/M chip 2 is provided on the multilayer wiring layer 23. An interlayer dielectric film 26 for joining is provided on the interlayer dielectric film 25.

That is, the pixel chip 1, and the L/M chip 2 are stacked one on another by joining the junction surface (the lower surface in FIG. 3) of the interlayer dielectric film 15 which is the first main surface S1 of the pixel chip 1, and the junction surface (the top surface in FIG. 3) of the interlayer dielectric film 26 which is the second main surface S2 of the L/M chip 2.

While there are chip joining methods such as plasma joining or joining by using adhesives, for example, it is assumed that the chips are joined by plasma joining in the present embodiment. In a case of plasma joining, plasma activation joining is performed taking the temperature robustness of MTJ elements into consideration. That is, a plasma activation process is performed on the junction surfaces of the pixel chip 1 and the L/M chip 2, and the junction surfaces are placed one on another, temporarily joined at normal temperature, and then are rigidly joined by performing an annealing process (heat process) at 350° C. to 450° C. In addition, as another joining method, there also is a joining method in which, for example, as in Cu—Cu joining or the like mentioned above, copper pads are provided such that their front surfaces (junction surfaces) are exposed at the facing surfaces (junction interfaces) of the interlayer dielectric film 15, and the interlayer dielectric film 26, and the copper pads are joined directly. This Cu—Cu joining can also establish electrical connections between the chips.

Note that the interlayer dielectric films 12*a*, 13 to 15, 23*a*, 25, and 26 are silicon oxide films (SiO2 films, SiO2H films, SiOCH films, etc.), or silicon nitride films (SiN films, SiNH films, etc.). In one example, the interlayer dielectric films 11*a*, 13, 15, 23*a*, and 26 are silicon oxide films, and the interlayer dielectric films 14 and 25 are silicon nitride films.

Figure 4:
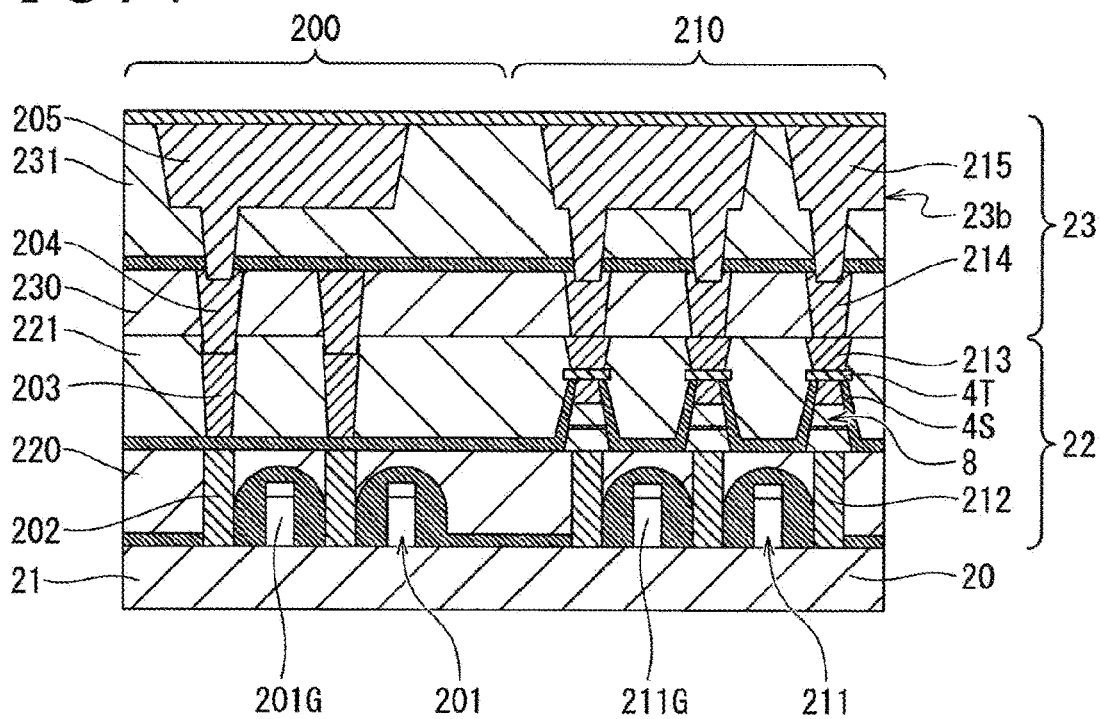
FIG. 4 is an enlarged view of main sections of a section A in FIG. 3.

As depicted in FIG. 4, the logic circuit section 200 has a plurality of MOS transistors 201 including CMOS transistors, and a plurality of contacts 202. The plurality of MOS transistors 201, and the plurality of contacts 202 are arranged via an interlayer dielectric film 220. Additionally, the logic circuit section 200 has a plurality of contacts 203 that is arranged via an interlayer dielectric film 221. Each contact 202 is provided to penetrate the interlayer dielectric film 220 in the depth direction. One end section (a lower end section in FIG. 4) of the contact 202 is connected to one of diffusion regions of a MOS transistor 201, and the other end section (an upper end section in FIG. 4) of the contact 202 is connected to one end section (a lower end section in FIG. 4) of a contact 203. Each contact 203 is provided to penetrate the interlayer dielectric film 221 in the depth direction. The other end section (an upper end section in FIG. 4) of the contact 203 is connected to one end section (a lower end section in FIG. 4) of a metal wire 204 included in a multilayer wire 23*b*.

The memory section 210 has a memory cell array in which a plurality of memory cells is arrayed in a two-dimensional grid. Each memory cell has a storage element 8, a selection transistor 211 and a contact 212. The contact 212 electrically connects one of diffusion regions of the selection transistor 211, and the storage element. The memory section 210 further has an upper protective film 4T that covers one end surface (an upper end surface in FIG. 4) of the storage element 8, a side protective film 4S that covers the side surface of the storage element 8, and a conductive via 213. The conductive via 213 electrically connects the storage element 8 and a multilayer wire 23*b*.

Note that the first semiconductor substrate 10 corresponds to the first substrate described in claims, and the second semiconductor substrate 20 corresponds to the second substrate described in claims. In addition, the upper protective film 4T corresponds to the first protective film described in claims, and the side protective film 4S corresponds to the second protective film described in claims.

The selection transistor 211 is arranged via the interlayer dielectric film 220, and includes a MOS transistor. The contact 212 is provided to penetrate the interlayer dielectric film 220 in the depth direction. One end section (an upper end section in FIG. 4) of the contact 212 is connected with the other end surface (a lower end surface in FIG. 4) of the storage element 8, and the other end section (a lower end section in FIG. 4) of the contact 212 is connected with one of diffusion regions of the selection transistor 211. The conductive via 213 is provided by being drilled through the interlayer dielectric film 221 in the depth direction. One end section (a lower end section in FIG. 4) of the conductive via 213 is connected with the upper protective film 4T, and the other end section (an upper end section in FIG. 4) of the conductive via 213 is connected with a metal wire 214.

Here, in FIG. 4, representative ones of a plurality of MOS transistors 201 included in the logic circuit section 200, and a plurality of selection transistors 211 included in the memory section 210 are depicted. On the logic circuit section 200 side of a well region 21, a gate electrode 201G is provided via the gate insulating film. The gate insulating film, the gate electrode 201G, and source/drain regions are included in the MOS transistor 201. Similarly, on the memory section 210 side of the well region 21, a gate electrode 211G is provided via the gate insulating film. The gate insulating film, the gate electrode 211G, and source/drain regions are included in the selection transistor 211. Each transistor in the plurality of MOS transistors 201 and the plurality of selection transistors 211 is separated by an element separation region (not depicted in figures) with an STI structure, for example.

The multilayer wires 23b included in the multilayer wiring layer 23 have metal wires 204 and 205 on the logic circuit section 200 side, and metal wires 214 and 215 on the memory section 210 side. The metal wires 204 and 205 and the metal wires 214 and 215 are arranged via interlayer dielectric films 230 and 231 included in the interlayer dielectric film 23a. One end section (a lower end section in FIG. 4) of the metal wire 204 is connected to the other end section (an upper end section in FIG. 4) of the contact 203, and the other end section (an upper end section in FIG. 4) of the metal wire 204 is connected to one end section (a lower end section in FIG. 4) of the metal wire 205. One end section (a lower end section in FIG. 4) of the metal wire 214 is connected to the other end section (an upper end section in FIG. 4) of the conductive via 213, and the other end section (an upper end section in FIG. 4) of the metal wire 214 is connected to one end section (a lower end section in FIG. 4) of the metal wire 215.

Note that the metal wires 204, 205, 214, and 215 include Cu or Au, for example.

In addition, the contacts 202, 203, and 212 include tungsten (W), for example. Note that W is not the sole example, and the contacts 202, 203, and 212 may include titanium (Ti), platinum (Pt), palladium (Pd), Cu, tungsten titanium (TiW), tungsten titanium nitride (TiNW), tungsten silicide (WSi$_2$), molybdenum silicide (MoSi$_2$), or the like. In addition, the contacts 202, 203, and 212 may include polysilicon doped with impurities, metal silicide, or the like. In addition, the contacts 202, 203, and 212 may have configurations of plugs filled with any of the materials described above, or may have configurations of holes having any of the materials described above formed as films on the inner walls of contact holes.

In addition, the conductive via 213 includes Cu or Au, for example.

In addition, the interlayer dielectric films 220, 221, 230, and 231 are silicon oxide films or silicon nitride films. As one example, all of the interlayer dielectric films 220, 221, 230, and 231 are silicon oxide films.

First Embodiment

Next, the L/M chip 2 included in the solid-state image pickup apparatus 100 is explained in more detail.

First, the high temperature steam cross link phenomenon that occurs due to an annealing process (heat process) at the time of chip joining is explained.

Figure 5:
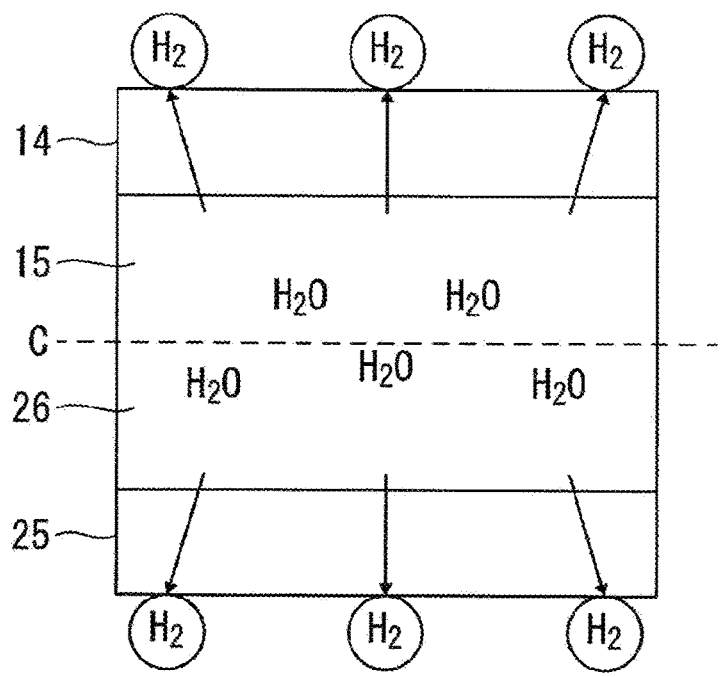
FIG. 5 is a figure for explaining the high temperature steam cross link phenomenon.
Figure 5:
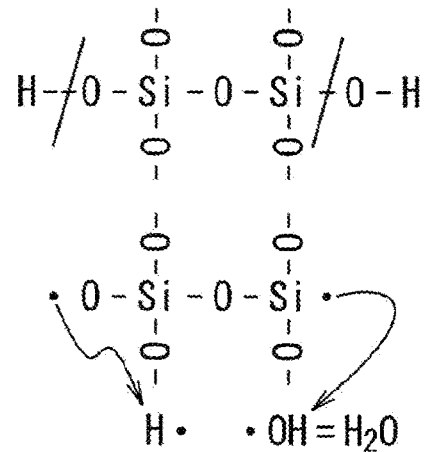
Figure 5:
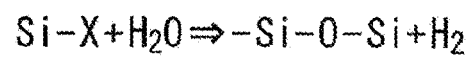
Figure 6:
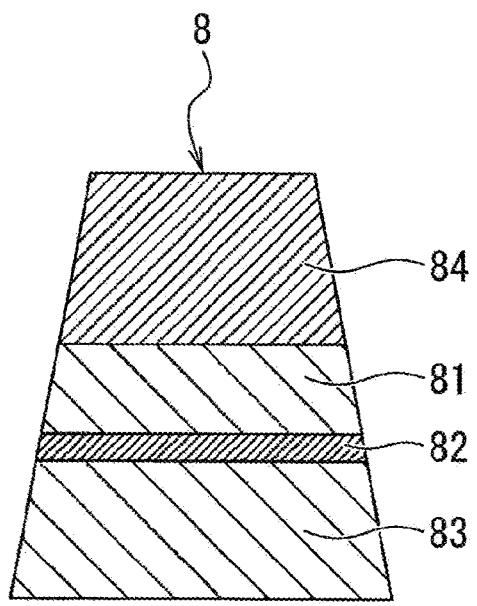
FIG. 6 is a cross-sectional view depicting the configuration of an MTJ element according to a first embodiment.

As mentioned earlier, the pixel chip 1 and the L/M chip 2 are joined by joining, by plasma activation joining, the junction surfaces of the interlayer dielectric films 15 and 26 (hereinafter, referred to as "silicon oxide films 15 and 26") included in the first main surface S1 and the second main surface S2, respectively. As depicted in FIG. 5, the silicon oxide films 15 and 26 in the joined state are vertically sandwiched by the interlayer dielectric films 14 and 25 (hereinafter, referred to as "silicon nitride films 14 and 25"). That is, an annealing process is performed in this sandwiched state. In the annealing process, a thermal history of 400° C., for example, is added to the silicon oxide films 15 and 26.

Here, the silicon oxide films 15 and 26 are insulating films including a lot of silanol groups (—OH). In addition, the silicon nitride films 14 and 25 are insulating films that are superior in moisture resistance. Accordingly, if a thermal history of 400° C. is added, water (H$_2$O) is desorbed from the silicon oxide films 15 and 26. Then, this desorbed water is enclosed in the silicon nitride films 14 and 25, and accordingly becomes unable to be diffused externally. In this manner, water that has been sealed in due to a process that involves a thermal history of a high temperature becomes steam (has an increased pressure). At that time, an oxidation reaction is facilitated as depicted in Reaction Formula (1) described below, and activated hydrogen (H$_2$) is generated. This phenomenon is the high temperature steam cross link phenomenon.

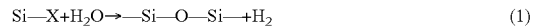

$$\text{Si—X+H}_2\text{O} \rightarrow \text{—Si—O—Si—+H}_2 \tag{1}$$

If the high temperature steam cross link phenomenon occurs, as depicted in FIG. 5, the activated hydrogen (H2) passes through the silicon nitride films 14 and 25. This hydrogen passes also through the multilayer wiring layer 23, and reaches the L/M mixed layer 22.

Note that, other than the film composition near the joining portion C, there are film compositions that can be the source of occurrence of the high temperature steam cross link phenomenon also in the multilayer wiring layers 12 and 23, and the like. However, considering the total layer film thickness, and hydrogen degassing amount, the stacked structure of the silicon oxide films 15 and 26, and the silicon nitride films 14 and 25 near the joining portion C becomes dominant in terms of property deterioration of the storage elements 8.

Next, the configuration of the storage elements 8 is explained. In the first embodiment, each storage element 8 includes an MTJ element having a heat-resistant property (to 400° C.). Hereinafter, the storage elements 8 are referred to as MTJ elements 8.

The MTJ element 8 includes a magnetic material having perpendicular magnetic anisotropy. The MTJ element 8 includes a free layer (also called a storage layer, a recording layer, a magnetization inverted layer, a magnetization free layer, or a Magnetic Free Layer) 81 whose magnetization direction is variable. Additionally, the MTJ element 8 includes a pinned layer (also called a magnetization fixed layer or a Magnetic Pinned Layer) 83 whose magnetization is fixed, and a tunnel barrier layer (also called a tunnel insulation layer) 82 formed between the free layer 81 and the pinned layer 83. Furthermore, the MTJ element 8 includes an upper electrode 84 provided on the free layer 81.

The MTJ element 8 according to the first embodiment has a bottom pinned structure in which the pinned layer 83 is formed on a lower electrode (contact 212), and the free layer 81 is formed on the pinned layer 83 via the tunnel barrier layer 82. Note that this structure is not the sole example, and a top pinned structure in which the free layer 81 is formed on the lower electrode, and the pinned layer 83 is formed on the free layer 81 via the tunnel barrier layer 82 may be adopted. In addition, the MTJ element 8 is connected with a selection transistor 211, and an NMOS FET is typically used as the selection transistor 211.

When the magnetization direction of the free layer 81 is parallel to the magnetization direction of the pinned layer 83, the MTJ element 8 has a lower resistance, and when the magnetization direction of the free layer 81 is anti-parallel to the magnetization direction of the pinned layer 83, the MTJ element 8 has a high resistance. This difference in the state of resistance is used for storage of information.

The free layer 81 includes a magnetic metal film having, as its principal component, cobalt (Co), iron (Fe), or the like, for example. In the first embodiment, the free layer 81 includes an alloy of Co, Fe and boron (B) (hereinafter, referred to as a "CoFeB alloy"). The tunnel barrier layer 82 includes magnesium oxide (MgO), aluminum oxide (AlO), or the like, for example. In the first embodiment, the tunnel barrier layer 82 includes magnesium oxide (MgO). The tunnel barrier layer 82 including an MgO layer can have a higher magneto-resistance change rate (MR ratio). The pinned layer 83 includes a magnetic metal film similar to that of the free layer 81. That is, in the first embodiment, the pinned layer 83 includes a CoFeB alloy.

The upper electrode 84 includes tantalum (Ta), Al, Cu, W, or the like, for example. In the first embodiment, the upper electrode 84 includes Ta.

The MTJ element 8 with such a configuration experiences, for example, an MgO reduction reaction or the like due to the influence of active hydrogen generated by the high temperature steam cross link phenomenon, and a magnetic property of the MTJ element 8 deteriorate. The active hydrogen not only enters from the side surface of the MTJ element 8, but also enters passing through Ta, Al, Cu, W, or the like used for the upper electrode 84. Accordingly, it is necessary to prevent entrance of hydrogen from the side surface, and top surface of the MTJ element 8.

In view of this, in the first embodiment, the electrically conductive upper protective film 4T having a property of inhibiting entrance of hydrogen is formed on the top surface (the top surface of the upper electrode 84) of the MTJ element 8, and the insulating side protective film 4S having a property of inhibiting entrance of hydrogen is formed on the side surface of the MTJ element 8.

Hereinafter, on the basis of FIGS. 7A, 7B, 7C, 7D, 7E, and 7F, one example of a method of manufacturing a memory section 210 of the L/M chip 2 is explained in order of steps. Note that steps after the formation of a selection transistor 211 are explained. The memory section 210 is manufactured by using various types of apparatuses such as film forming apparatuses (including a CVD (Chemical Vapor Deposition) apparatus, and a sputtering apparatus), a heat processing apparatus, a lithography apparatus, an etching apparatus, or a CMP (Chemical Mechanical Polishing) apparatus. Hereinafter, these apparatuses are collectively referred to as a manufacturing apparatus.

Figure 7A:
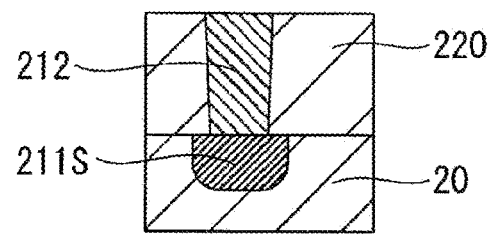
FIG. 7A is a cross-sectional view depicting a method of manufacturing a memory section of a logic memory chip according to the first embodiment of the present disclosure in order of steps.

The manufacturing apparatus forms the selection transistor 211 on the second semiconductor substrate 20 by a well-known method, and then forms an interlayer dielectric film 220 (hereinafter, referred to as a "silicon oxide film 220") including a silicon oxide film by using a plasma CVD method as depicted in FIG. 7A. Thereafter, by using lithography, etching and plasma CVD methods, and the like, a contact 212 that penetrates the silicon oxide film 220 in the depth direction (vertically in FIG. 7A) is formed on a diffusion region (here, a source region 211S) of the selection transistor 211. In the first embodiment, the contact 212 includes W, for example.

Figure 7B:
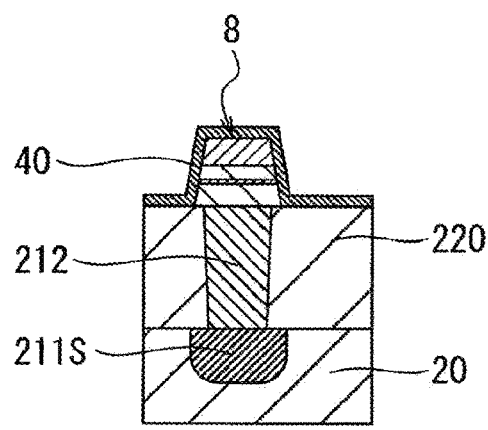
FIG. 7B is a cross-sectional view depicting the method of manufacturing the memory section of the logic memory chip according to the first embodiment in order of steps.

Next, as depicted in FIG. 7B, the manufacturing apparatus then forms an MTJ element 8 on the contact 212 by a well-known method, and forms an insulating film 40 over the entire surface of the silicon oxide film 220 including the top surface and side surface of the MTJ element 8 by a plasma CVD method such that a thickness of the insulating film 40 becomes approximately 30 [nm], for example. Here, the insulating film 40 is a film for forming the side protective film 4S, and, in the first embodiment, is formed of an insulation material having a property of inhibiting entrance of active hydrogen. Specifically, the insulating film 40 is formed of a silicon nitride film in the first embodiment. Hereinafter, the insulating film 40 is referred to as a silicon nitride film 40. Note that the insulating film 40 is not limited to a silicon nitride film, but may be formed of a film of another material as long as it has a similar function.

Figure 7C:
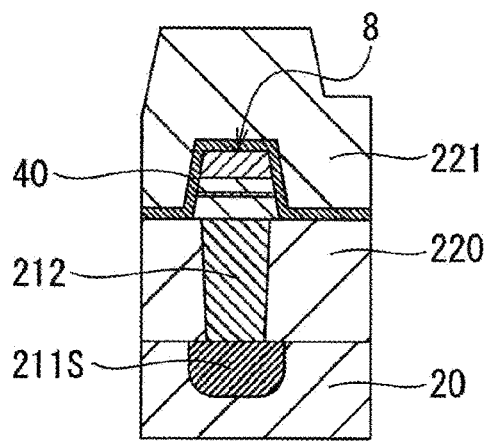
FIG. 7C is a cross-sectional view depicting the method of manufacturing the memory section of the logic memory chip according to the first embodiment in order of steps.
Figure 7D:
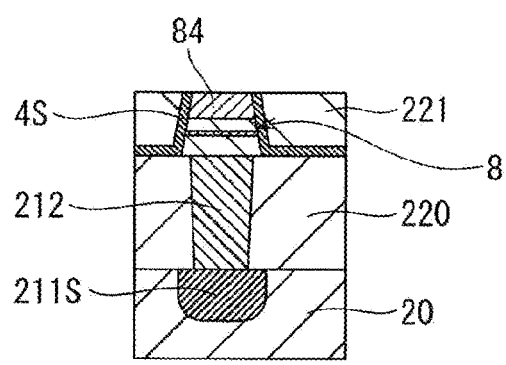
FIG. 7D is a cross-sectional view depicting the method of manufacturing the memory section of the logic memory chip according to the first embodiment in order of steps.

Next, as depicted in FIG. 7C, the manufacturing apparatus forms an interlayer dielectric film 221 (hereinafter, referred to as a "silicon oxide film 221") including a silicon oxide film on the silicon nitride film 40 by using a plasma CVD method such that a thickness of the interlayer dielectric film 221 becomes 500 [nm], for example. Next, as depicted in FIG. 7D, the manufacturing apparatus removes the silicon oxide film 221 by using the CMP apparatus until the silicon nitride film 40 on the MTJ element 8 is exposed. Subsequently, the silicon nitride film 40 on the MTJ element 8 is removed by anisotropic etching until the top surface of the upper electrode 84 is exposed. Thereby, a portion of the silicon nitride film 40 that covers the side surface of the MTJ element 8 becomes a side protective film 4S.

Figure 7E:
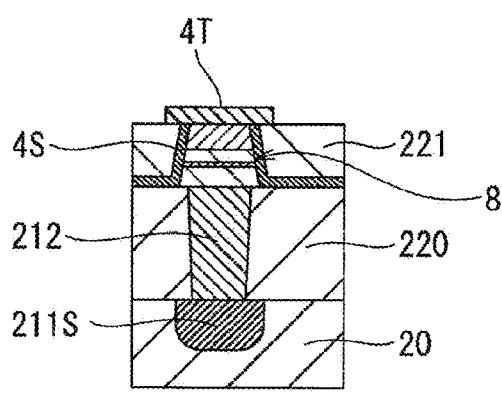
FIG. 7E is a cross-sectional view depicting the method of manufacturing the memory section of the logic memory chip according to the first embodiment in order of steps.

Next, the manufacturing apparatus forms a metal film to function as the upper protective film 4T on the silicon oxide film 221 including the top surface of the upper electrode 84 by a sputtering method such that a thickness of the metal film becomes 30 [nm], for example. Thereafter, as depicted in FIG. 7E, the lithography apparatus is used to perform patterning such that a pattern with a desired shape is formed on the metal film, and then to form the upper protective film 4T by etching. In the first embodiment, the upper protective film 4T is formed of an electrically conductive metal material having a function of inhibiting entrance of hydrogen into the MTJ element 8. Specifically, the upper protective film 4T includes palladium (Pd), which is one of metals (hereinafter, referred to as "hydrogen storage metals") having a function of storing hydrogen. Note that Pd is not the sole example, and the upper protective film 4T may include another hydrogen storage metal such as Ti, Mg, Ni, vanadium (V), manganese (Mn), zirconium (Zr), or iridium (Ir), or may include an alloy of any of these.

In addition, the upper protective film 4T is formed to have a shape such as a rectangular shape or a circular shape in a plan view, for example. In addition, in the first embodiment, the upper protective film 4T is formed to have a shape, in a plan view, that includes the top surface (an end surface on the joining portion C side) of the upper electrode 84 entirely, and surrounds the top surface only to such an extent that the upper protective film 4T does not short-circuit with another adjacent MTJ element 8. In the first embodiment, the upper protective film 4T is formed to cover at least the top surface of the upper electrode 84, and the top surface of the side protective film 4S entirely, and an area including their peripheries, and is formed to be as large as possible only to such an extent that the upper protective film 4T does not short-circuit. Thereby, it becomes possible to more surely inhibit entrance of active hydrogen into the MTJ element 8 from above, and also it becomes easier to form the conductive via 213.

Here, the upper protective film 4T corresponds to the first protective film described in claims, and the side protective film 4S corresponds to the second protective film described in claims.

Figure 7F:
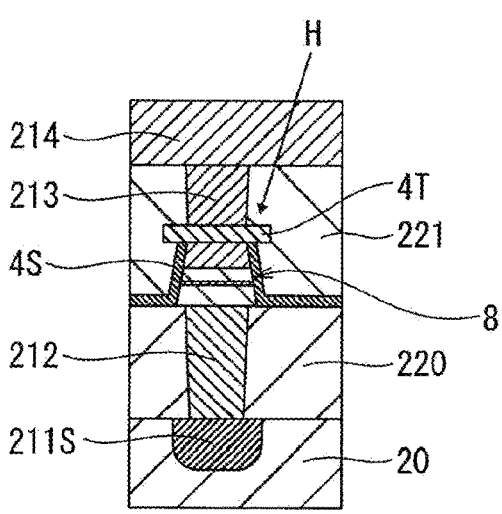
FIG. 7F is a cross-sectional view depicting the method of manufacturing the memory section of the logic memory chip according to the first embodiment in order of steps.

Next, as depicted in FIG. 7F, the manufacturing apparatus forms a via hole on the upper protective film 4T of the silicon oxide film 221 by lithography and etching, and then forms a barrier layer and a seed layer in the via hole by the film forming apparatus. Next, by a plating method, a wire material (e.g. Cu or Au) is embedded in the via hole covered with the seed layer, and then is flattened by the CMP apparatus to form a conductive via 213. Subsequently, by using a plasma CVD method, an interlayer dielectric film 230 (hereinafter, referred to as a "silicon oxide film 230") including a silicon oxide film is formed on the silicon oxide film 221. Next, by lithography and etching, a trench (wire groove) is formed through the silicon oxide film 230 on the conductive via 213, and then a barrier layer and a seed layer are formed in the trench by the film forming apparatus. Next, by a plating method, a wire material (e.g. Cu or Au) is embedded in the trench covered with the seed layer, and then is flattened by the CMP apparatus to form a metal wire 214.

Here, the barrier layer is formed to prevent the material (e.g. Cu or Au) included in the electrode section formed in the via hole or the trench from being diffused to peripheries around the electrode section. The barrier layer includes, for example, tantalum (Ta), tantalum nitride (TaN), titanium (Ti), titanium nitride (TiN), or an alloy film including any of these. In addition, the seed layer is an electrode layer for supplying current to be used at the time of plating. The seed layer includes Cu or Au, for example. Note that, while the conductive via 213 and the metal wire 214 are formed by the single damascene method in the example explained, this example is not the sole example, and they may be formed by using the dual damascene method.

Thereafter, the manufacturing apparatus forms a plurality of interlayer dielectric films such as the interlayer dielectric films 230 and 231, and a plurality of layers of metal wires included in a multilayer wire 23b, such as the metal wire 215, on the metal wire 214. Note that, while the manufacturing method is explained with a focus on one memory cell, a similar manufacturing method is applied to all memory cells included in the memory section 210. In addition, each step is performed simultaneously and in parallel for each set of a plurality of memory cells, or all memory cells.

As explained above, the solid-state image pickup apparatus 100 according to the first embodiment of the present disclosure includes: the pixel chip 1 having: the first semiconductor substrate 10; and the pixel region 103 including the plurality of pixels 102 that is formed in the first semiconductor substrate 10, that outputs pixel signals according to amounts of electric charges generated by photoelectric conversion, and that is arrayed in a two-dimensional grid; and the logic memory chip 2 that is stacked on the pixel chip 1, and that has the second semiconductor substrate 20, and the logic circuit section 200 and the memory section 210 (including a non-volatile memory) that are formed in the second semiconductor substrate 20. The upper protective film 4T having a property of inhibiting entrance of hydrogen is formed on an end surface of a storage element 8 included in each memory cell of the memory section 210 which end surface is on a side facing the pixel chip 1. Furthermore, the side protective film 4S having a property of inhibiting entrance of hydrogen is formed on the side surface of the storage element 8.

According to this configuration, the upper protective film 4T provided on the end surface of the storage element 8 on the junction surface side, and the side protective film 4S provided on the side surface of the storage element 8 can prevent entrance of atoms and molecules such as hydrogen that have a negative influence on the storage element 8 from the end surface (the upper end surface in the first embodiment) on the junction surface side, in addition to entrance from the side surface.

In addition, in the solid-state image pickup apparatus 100, the memory section 210 is a magneto-resistive random access memory having: a magnetic tunnel junction element (MTJ element) 8 having a heat-resistant property as the storage element 8; a selection transistor 211; and a contact 212 that connects one (e.g. a source region 211S) of diffusion regions of the selection transistor 211 and the MTJ element 8. Furthermore, the MTJ element 8 is provided near the selection transistor 211 (directly above the contact 212 in the first embodiment).

Because, according to this configuration, the non-volatile memory included in the memory section 210 includes the magneto-resistive random access memory having the MTJ element 8, it becomes possible to realize higher density, lower power consumption, and less leakage of the memory section 210. Furthermore, because the MTJ element 8 having a heat-resistant property is provided near the selection transistor 211, the function of the memory section 210 can be enhanced.

In addition, in the solid-state image pickup apparatus 100, the upper protective film 4T is a metal film including a hydrogen storage metal. Specifically, the upper protective film 4T is a metal film including any one type or a plurality of types of any of metal selected from titanium, magnesium, nickel, palladium, vanadium, manganese, zirconium, and iridium which are hydrogen storage metals, for example. Then, the upper protective film 4T is provided on the upper electrode 84 forming the upper end surface of the MTJ element 8.

According to this configuration, without hindering the energization of the upper electrode 84, for example, it becomes possible to cause active hydrogen coming from the upper-end-surface side of the MTJ element 8 due to the high temperature steam cross link phenomenon to be stored in the upper protective film 4T, and inhibit the active hydrogen from reaching the MTJ element 8. As a result, it becomes possible to prevent or reduce deterioration of the MTJ element 8 due to atoms or molecules such as active hydrogen.

In addition, in the solid-state image pickup apparatus 100, the upper protective film 4T has an area size larger than an area size of the upper end surface of the MTJ element 8.

Specifically, in a plan view, the upper protective film 4T is formed to encircle the upper end surface entirely, and surround the upper end surface only to such an extent that the upper protective film 4T does not short-circuit with another adjacent element. In the first embodiment, the upper protective film 4T is formed as large as possible only to such an extent that the upper protective film 4T does not short-circuit with another adjacent MTJ element 8.

Figure 8A:
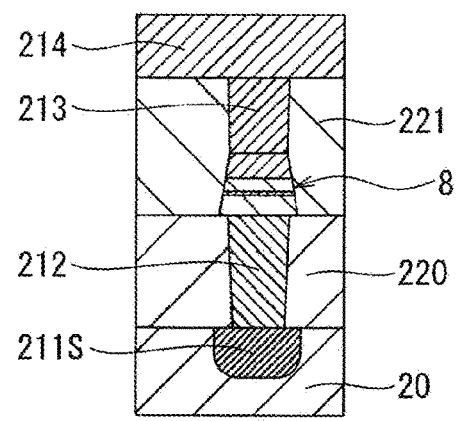
FIG. 8A is a cross-sectional view depicting a configuration example of a conventional memory section.
Figure 8B:
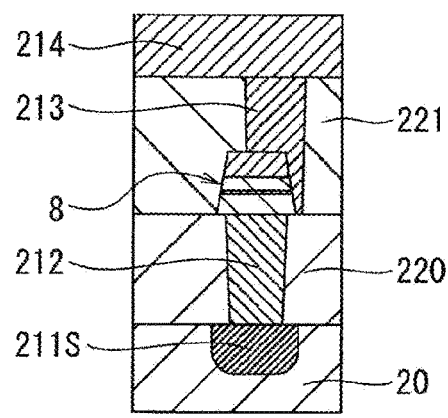
FIG. 8B is a cross-sectional view depicting an example in which misalignment of a conductive via occurred in the conventional memory section in FIG. 8A.

Here, in a conventional configuration in which an MTJ element 8 is formed directly above a contact 212, as depicted in FIG. 8A, a size of a diameter of a conductive via 213 is made as large as possible relative to a size of a diameter of an upper electrode 84 for reduction of the contact resistance. Accordingly, there is a fear that, if misalignment of the formation position of the conductive via 213 occurs, as depicted in FIG. 8B, a problem that a free layer 81 and a pinned layer 83 are short-circuited via the conductive via 213 occurs. Although it is also possible to cope with this by reducing the size of the diameter of the conductive via 213, this is not preferred because the contact resistance increases. Note that, while the side surface of the MTJ element 8 is caused to be covered with the side protective film 4S having an insulating property in the first embodiment described above, there is a fear that, due to misalignment, the conductive via 213 is formed in a state that the conductive via 213 protrudes from the side protective film 4S, and a short circuit cannot be avoided.

Figure 9:
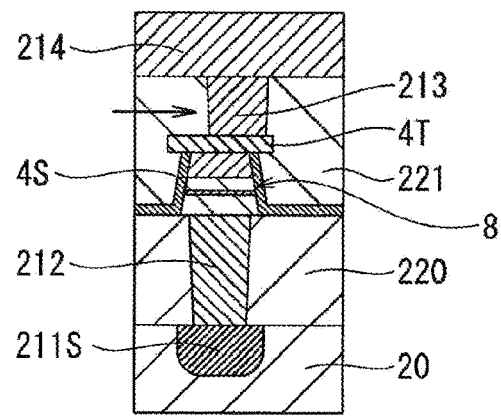
FIG. 9 is a cross-sectional view depicting an example in which misalignment of a conductive via occurred in the memory section according to the first embodiment.

In view of this, in the solid-state image pickup apparatus 100 according to the first embodiment of the present disclosure, as mentioned above, the upper protective film 4T is formed to surround the upper end surface in a plan view, and to be as large as possible only to such an extent that the upper protective film 4T does not short-circuit with another adjacent MTJ element 8. Thereby, for example, as depicted in FIG. 9, even if positional misalignment that conventionally results in misalignment occurs, it becomes possible to cause the upper protective film 4T to receive the conductive via 213, and it becomes possible to avoid the problem that the free layer 81 and the pinned layer 83 are short-circuited.

In addition, in the solid-state image pickup apparatus 100, the pixel chip 1 has the plurality of pixel transistors that are included in the pixel region 103, the multilayer wiring layer 12, and the interlayer dielectric film for joining 15, the plurality of pixel transistors and the multilayer wiring layer 12 being formed on the first main surface S1 side which is one surface of the pixel chip 1, the interlayer dielectric film 15 for joining being formed on a layer above the plurality of pixel transistors and the multilayer wiring layer 12. Additionally, the logic memory chip 2 has the logic circuit section 200 and the memory section 210, the multilayer wiring layer 23, and the interlayer dielectric film 26 for joining, the logic circuit section 200, the memory section 210, and the multilayer wiring layer 23 being formed on the second main surface S2 side of the logic memory chip 2 which is one surface side of the logic memory chip 2, the interlayer dielectric film 26 for joining being formed on a layer above the logic circuit section 200, the memory section 210, and the multilayer wiring layer 23. Furthermore, the pixel chip 1, and the logic memory chip 2 are stacked one on another by joining the interlayer dielectric films 15 and 26 that are formed on the first main surface S1 side, and on the second main surface S2 side.

According to this configuration, the first main surface S1 of the pixel chip 1 where the pixel region 103 is provided, and the second main surface S2 of the L/M chip 2 where the logic circuit section 200 and the memory section 210 are provided are joined to form the stacked chip 3. Thereby, it becomes possible to form a stacked chip having a superior memory function as compared with a case that the first main surface S1, and the second back surface B2 are joined, for example.

Modification Example 1 of First Embodiment

The MTJ element 8 is provided directly above the contact 212 in the configuration explained in the first embodiment mentioned above. A first modification example of the first embodiment is different from the first embodiment described above in that the MTJ element 8 is formed not directly above the contact 212.

Figure 10A:
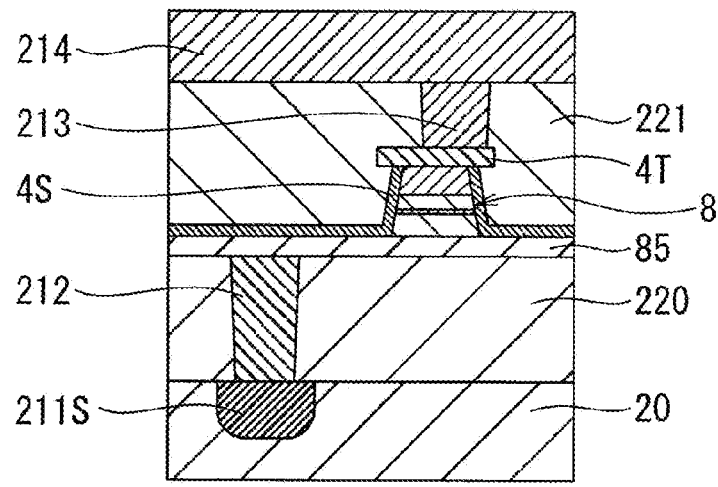
FIG. 10A is a cross-sectional view depicting a configuration example of a memory section according to a first modification example of the first embodiment.

In the first modification example, for example, as depicted in FIG. 10A, a lower electrode 85 having a width larger than the width (the lateral width in FIG. 10A) of the MTJ element 8 is provided at an upper section of the contact 212. Then, the MTJ element 8 is formed at a position on the lower electrode 85, and away from the contact 212. Note that the lower electrode 85 may include a material similar to a material of the upper electrode 84, or may include a different material as long as it is an electrically conductive material.

In a case of the configuration in FIG. 10A, in addition to effects and advantages equivalent to those in the first embodiment described above, it becomes possible to enhance the degree of freedom of arrangement of the MTJ element 8 as compared to the first embodiment described above.

Second Modification Example of First Embodiment

In the example explained in the first embodiment mentioned above, the upper protective film 4T is configured to have such a size that, in a plan view, the upper protective film 4T encircles the upper end surface of the MTJ element 8 and the upper end section of the side protective film 4S entirely, and surrounds them only to such an extent that the upper protective film 4T does not short-circuit with another adjacent element. A second modification example of the first embodiment is different from the first embodiment described above in that the upper protective film 4T is configured to have such a size that the upper protective film 4T does not surround the upper end section of the side protective film 4S in a plan view.

Figure 10B:
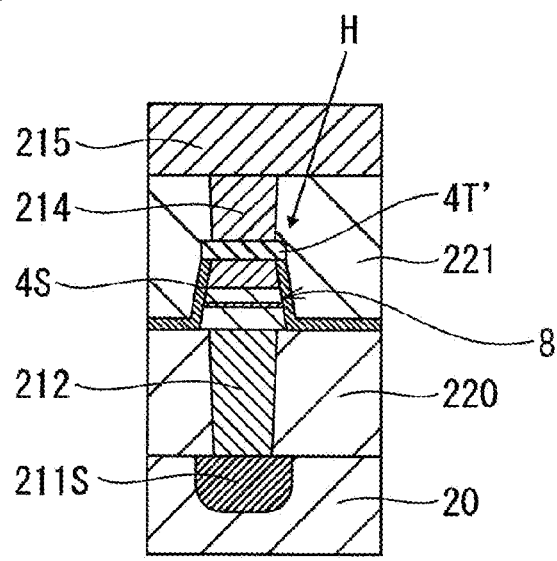
FIG. 10B is a cross-sectional view depicting a configuration example of a memory section according to a second modification example of the first embodiment.

In the second modification example, for example, as depicted in FIG. 10B, the upper protective film 4T is formed such that the upper protective film 4T covers only the upper end surface of the MTJ element 8, and the upper end section of the side protective film 4S entirely. Note that this configuration is not the sole example, and the upper protective film 4T may be formed such that the upper protective film 4T covers only the upper end surface of the MTJ element 8.

In a case of the configuration in FIG. 10B, the protected range becomes smaller, and it becomes impossible to cope with misalignment by the degree corresponding to the size reduction of the upper protective film 4T, but effects and advantages similar to those in the first embodiment described above can be attained in terms of prevention or reduction of entrance of active hydrogen to the MTJ element 8 from the joining portion C side.

Second Embodiment

In the configuration explained in the first embodiment mentioned above, the upper protective film 4T including a metal film (hereinafter, referred to as a "film made of a hydrogen storage metal") including a hydrogen storage metal is provided on the upper end surface of the MTJ element 8, and the side protective film 4S including an insulating film (silicon nitride film) is provided on the side surface of the MTJ element 8. A second embodiment is different from the first embodiment described above in that a film made of a hydrogen storage metal is provided also on the side-surface side of the MTJ element 8.

Hereinafter, constituent sections similar to those in the first embodiment described above are given similar reference signs, explanations thereof are omitted as appropriate, and differences are explained in detail.

Here, while the side protective film 4S including an insulating silicon nitride film is provided on the side surface of the MTJ element 8 in the first embodiment described above, the capability of the insulating silicon nitride film in terms of prevention of entrance of active hydrogen generated by the high temperature steam cross link phenomenon is inferior, as compared to a film made of a hydrogen storage metal.

In view of this, in the second embodiment, a side protective film 4S2 including a film made of a hydrogen storage metal is formed further on the side protective film 4S (referred to as a "side protective film 4S1" in the second embodiment).

Hereinafter, on the basis of FIGS. 11A, 11B, 11C, 11D, and 11E, one example of a method of manufacturing the memory section 210 of the L/M chip 2 of the second embodiment is explained in order of steps. Note that the memory section 210 is manufactured by using a manufacturing apparatus similar to that in the first embodiment described above.

Here, in the second embodiment, because steps similar to the steps of the first embodiment described above that are depicted in FIGS. 7A and 7B are performed, explanations thereof are omitted. Steps to be performed thereafter are explained.

Figure 11A:
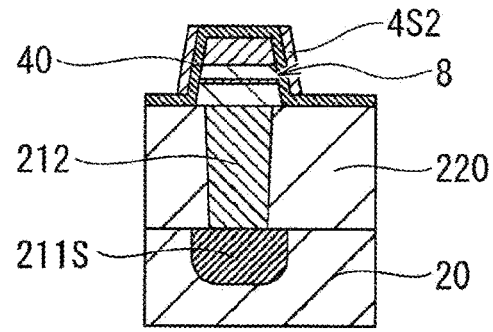
FIG. 11A is a cross-sectional view depicting a method of manufacturing a memory section of a logic memory chip according to a second embodiment of the present disclosure in order of steps.

After the step depicted in FIG. 7B, the manufacturing apparatus forms a film made of a hydrogen storage metal to function as the side protective film 4S2 over the entire surface including a portion covering the MTJ element 8 on the silicon nitride film 40 by a sputtering method such that the film made of the hydrogen storage metal has a thickness of 30 [nm], for example. Next, as depicted in FIG. 11A, the manufacturing apparatus performs anisotropic etching such that the film made of the hydrogen storage metal is left only on the side-surface side of the MTJ element 8. Thereby, a portion of the film made of the hydrogen storage metal that covers the side-surface side of the MTJ element 8 becomes the side protective film 4S2.

Note that the side protective film 4S2 includes Pd, which is one type of hydrogen storage metals, in the second embodiment. Note that Pd is not the sole example, and the side protective film 4S2 may include another hydrogen storage metal such as Ti, Mg, Ni, V, Mn, Zr, or Ir, or may include an alloy of any of these.

Figure 11B:
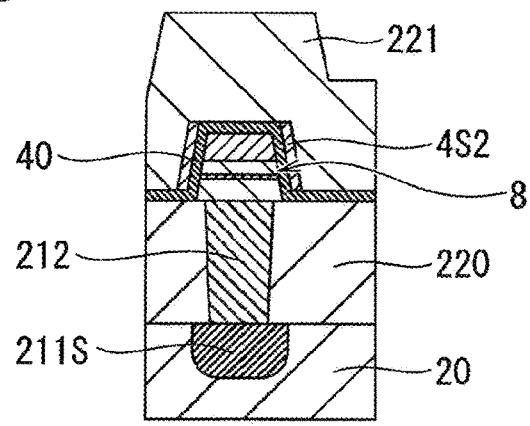
FIG. 11B is a cross-sectional view depicting the method of manufacturing the memory section of the logic memory chip according to the second embodiment in order of steps.
Figure 11C:
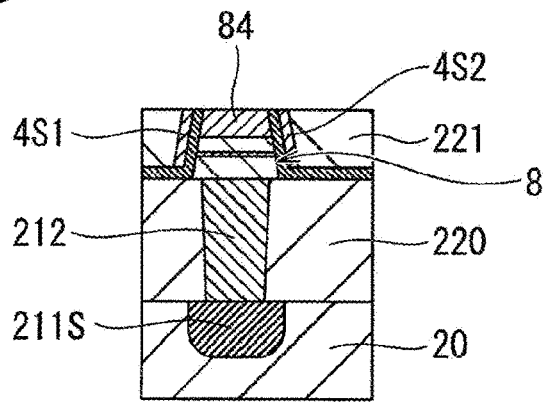
FIG. 11C is a cross-sectional view depicting the method of manufacturing the memory section of the logic memory chip according to the second embodiment in order of steps.

Next, as depicted in FIG. 11B, the manufacturing apparatus forms the silicon oxide film 221 on the silicon nitride film 40 and the side protective film 4S2 by using a plasma CVD method such that a thickness of the silicon oxide film 221 becomes 500 [nm], for example. Next, as depicted in FIG. 11C, the manufacturing apparatus removes the silicon oxide film 221 by using the CMP apparatus until the upper end surfaces of the silicon nitride film 40 and the side protective film 4S2 on the MTJ element 8 are exposed. Subsequently, the silicon nitride film 40 on the MTJ element 8 is removed by using anisotropic etching until the top surface of the upper electrode 84 is exposed. Thereby, a portion of the silicon nitride film 40 that covers the side surface of the MTJ element 8 becomes the side protective film 4S1.

Figure 11D:
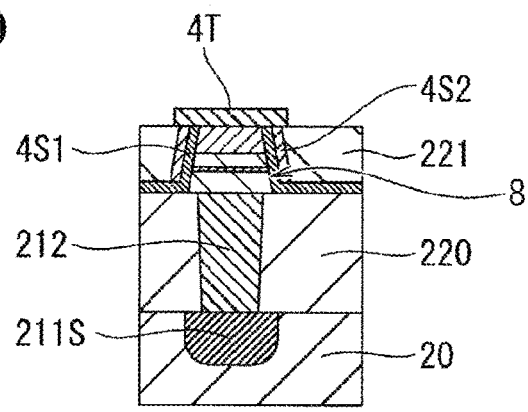
FIG. 11D is a cross-sectional view depicting the method of manufacturing the memory section of the logic memory chip according to the second embodiment in order of steps.

Next, the manufacturing apparatus forms a metal film to function as the upper protective film 4T on the silicon oxide film 221 including the top surfaces of the upper electrode 84 and the side protective films 4S1 and 4S2 by a sputtering method such that a thickness of the metal film becomes 30 [nm], for example. Thereafter, as depicted in FIG. 11D, patterning is performed on the metal film by lithography such that a pattern whose shape is similar to that in the first embodiment described above is formed, and thereafter, the upper protective film 4T is formed by etching.

Figure 11E:
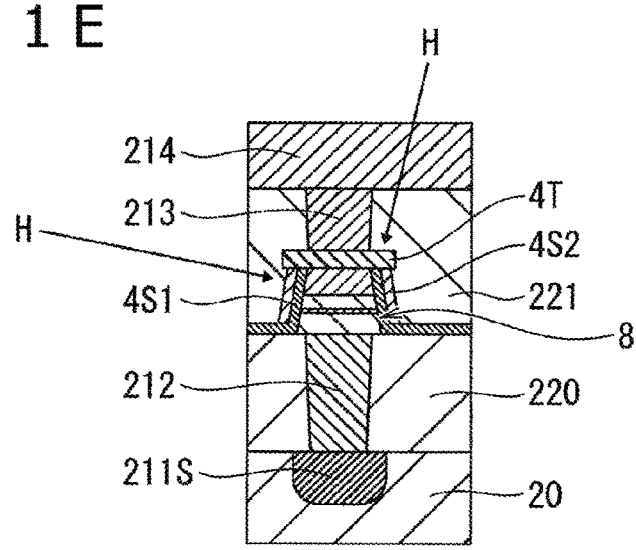
FIG. 11E is a cross-sectional view depicting the method of manufacturing the memory section of the logic memory chip according to the second embodiment in order of steps.

Next, as depicted in FIG. 11E, the manufacturing apparatus forms a via hole on the upper protective film 4T of the silicon oxide film 221 by lithography and etching and then forms a barrier layer, and a seed layer in the via hole by the film forming apparatus. Next, by a plating method, a wire material (e.g. Cu or Au) is embedded in the via hole covered with the seed layer, and then is flattened by the CMP apparatus to form a conductive via 213. Subsequently, by using a plasma CVD method, an interlayer dielectric film 230 (hereinafter, referred to as a "silicon oxide film 230") including a silicon oxide film is formed on the silicon oxide film 221. Next, by lithography and etching, a trench (wire groove) is formed through the silicon oxide film 230 on the conductive via 213, and then, a barrier layer and a seed layer are formed in the trench by the film forming apparatus. Next, by a plating method, a wire material (e.g. Cu or Au) is embedded in the trench covered with the seed layer, and then is flattened by the CMP apparatus to form a metal wire 214.

Thereafter, the manufacturing apparatus forms a plurality of interlayer dielectric films such as the interlayer dielectric films 230 and 231, and a plurality of layers of metal wires included in a multilayer wire 23b such as the metal wire 215 on the metal wire 214. Note that, while the manufacturing method is explained with a focus on one memory cell, a similar manufacturing method is applied to all memory cells included in the memory section 210. In addition, each step is performed simultaneously and in parallel for each set of a plurality of memory cells or all memory cells.

Figure 12:
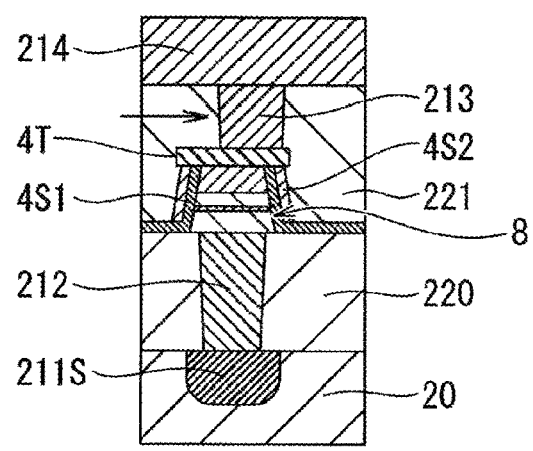
FIG. 12 is a cross-sectional view depicting an example in which misalignment of a conductive via occurred in the memory section according to the second embodiment.

Note that the upper protective film 4T of the second embodiment is configured such that, in a plan view, the upper protective film 4T encircles the top surfaces of the upper electrode 84, and the side protective films 4S1 and 4S2 entirely, and surrounds them only to such an extent that the upper protective film 4T does not short-circuit with another adjacent MTJ element 8. Due to this configuration, the upper protective film 4T can receive the conductive via 213 even if misalignment of the conductive via 213 occurs as depicted in FIG. 12. As a result, it becomes possible to prevent a short-circuit between the free layer 81 and the pinned layer 83 due to the misalignment.

As explained above, the solid-state image pickup apparatus 100 according to the second embodiment of the present disclosure includes: the pixel chip 1 having the first semiconductor substrate 10, and the pixel region 103 including the plurality of pixels 102 that is formed in the first semiconductor substrate 10, that outputs pixel signals according to amounts of electric charges generated by photoelectric conversion, and that is arrayed in a two-dimensional grid; and the logic memory chip 2 that is stacked on the pixel chip 1 and that has the second semiconductor substrate 20, and the logic circuit section 200 and the memory section 210 (including a magneto-resistive random access memory) that are formed in the second semiconductor substrate 20. The upper protective film 4T including the metal film including the hydrogen storage metal is formed on an end surface (the upper end surface in the second embodiment) of the MTJ element 8 included in each memory cell of the memory section 210 on a side where the MTJ element 8 faces the pixel chip 1. Furthermore, the insulating side protective film 4S1 having a property of inhibiting entrance of hydrogen is formed on the side surface of the MTJ element 8. Additionally, the side protective film 4S2 including the metal film including the hydrogen storage metal is formed on the side protective film 4S1.

Specifically, the side protective film 4S2 is a metal film including one type or a plurality of types of metal selected from titanium, magnesium, nickel, palladium, vanadium, manganese, zirconium, and iridium as hydrogen storage metals, for example.

According to this configuration, the upper protective film 4T provided on the end surface of the MTJ element 8 on the junction surface side, and the side protective films 4S1 and 4S2 provided on the side surface of the MTJ element 8 can prevent not only entrance of atoms and molecules such as hydrogen that have a negative influence on the MTJ element 8 from the side surface, but also entrance from the end surface on the junction surface side. Additionally, because not only the insulating side protective film 4S1, but also the side protective film 4S2 made of the hydrogen storage metal are provided on the side-surface side of the MTJ element, it is possible to more surely prevent or reduce entrance of atoms and molecules such as hydrogen that have a negative influence on the MTJ element 8 from the side surface of the MTJ element 8.

First Modification Example of Second Embodiment

In the configuration explained in the second embodiment mentioned above, the side protective film 4S2 including the film made of the hydrogen storage metal is provided on the side protective film 4S1 formed of the insulating silicon nitride film having a property of inhibiting entrance of hydrogen. A first modification example of the second embodiment is different from the second embodiment described above in that, instead of the side protective film 4S1, an insulating film not having a property of inhibiting entrance of hydrogen is provided on the side surface of the MTJ element 8, and the side protective film 4S2 is provided on the insulating film.

That is, although not depicted in figures, in the present first modification example, not a silicon nitride film, but the insulating film not having a property of inhibiting entrance of hydrogen is formed on the side surface of the MTJ element 8, and the side protective film 4S2 made of the hydrogen storage metal is provided on the insulating film. Examples of the insulating film not having a property of inhibiting entrance of hydrogen include a silicon oxide film and the like, for example.

According to this configuration, the protection performance becomes lower by a degree corresponding to the absence of a silicon nitride film, but due to the upper protective film 4T and the side protective film 4S2, it becomes possible to prevent or reduce entrance of atoms and molecules that have a negative influence on the storage element 8 from the upper end surface, in addition to entrance from the side surface.

Third Embodiment

In the configuration explained in the first and second embodiments described above, the protective films are formed on the side surface and top surface of the storage element 8 to prevent entrance of active hydrogen to the storage element 8. The configuration of the third embodiment corresponds to the configuration of the first or second embodiment, but is different from the configurations of the first and second embodiments described above in that a factor of generation of active hydrogen is removed.

Hereinafter, constituent sections similar to those in the first and second embodiments described above are given similar reference signs, explanations thereof are omitted as appropriate, and differences are explained in detail.

Figure 13A:
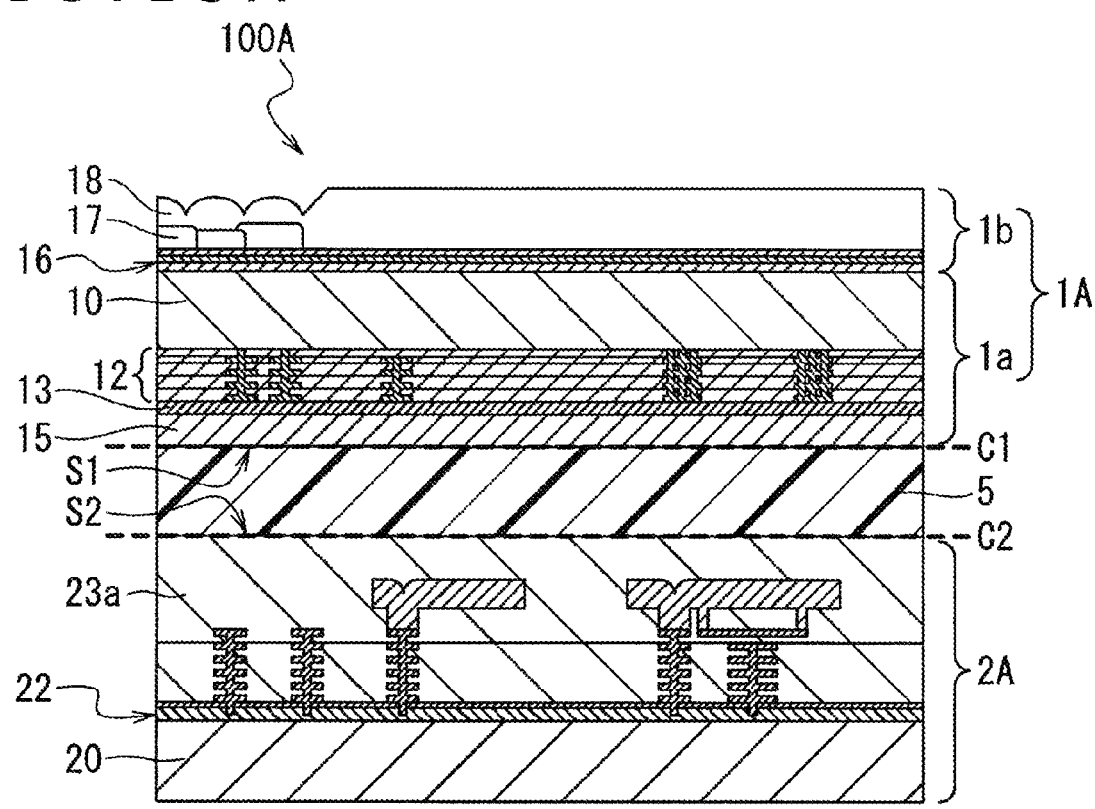
FIG. 13A is a cross-sectional view depicting a configuration example of a solid-state image pickup apparatus according to a third embodiment of the present disclosure.

A solid-state image pickup apparatus 100A according to the third embodiment includes a pixel chip 1A, and an L/M chip 2A as depicted in FIG. 13A.

The pixel chip 1A according to the third embodiment includes a pixel section 1a, and a lens section 1b. The pixel section 1a includes the first semiconductor substrate 10 having pixels such as pixel transistors that are formed in the well region 11, the multilayer wiring layer 12, the interlayer dielectric film (silicon oxide film) 13, and the interlayer dielectric film (silicon oxide film) 15. This is a configuration that corresponds to the configuration of the pixel chip 1 of the first embodiment described above, but is different in that the silicon nitride film 14 is removed, and the silicon oxide film 15 for joining is formed directly on the interlayer dielectric film 13. In the third embodiment, the interlayer dielectric film 13 is formed of the silicon oxide film, and the interlayer dielectric films that are on a side closer to the L/M chip 2A relative to the multilayer wiring layer 12 include only the silicon oxide films. That is, this is a configuration in which a nitride film such as the silicon nitride film 14 for warp adjustment which becomes a factor of occurrence of the high temperature steam cross link phenomenon is not provided on the side closer to the L/M chip 2A relative to the multilayer wiring layer 12. The lens section 1b includes the flattening layer 16, the color filter layers 17, and the microlenses 18.

The L/M chip 2A has a configuration that corresponds to the L/M chip 2 of the first embodiment described above, but is different in that the interlayer dielectric film (silicon nitride film) 25 and the interlayer dielectric film (silicon oxide film) 26 are removed. In the third embodiment, the interlayer dielectric film on a side closer to the pixel chip 1A relative to the multilayer wiring layer 23 includes only the silicon oxide film. That is, similarly to the pixel chip 1A, this is a configuration in which a nitride film such as the silicon nitride film 25 for warp adjustment which becomes a factor of occurrence of the high temperature steam cross link phenomenon is not provided on the side closer to the pixel chip 1A relative to the multilayer wiring layer 23. In addition, this is a configuration in which the silicon oxide film 26 also is removed because the interlayer dielectric film (silicon oxide film) 23a of the multilayer wiring layer 23 is used as a silicon oxide film for joining. Note that this configuration is not the sole example, and the silicon oxide film 26 may not be removed, but be left as an interlayer dielectric film for joining.

Then, in the third embodiment, the end surface of the silicon oxide film 15 which is the first main surface S1 of the pixel chip 1A, and the end surface of the silicon oxide film 23a which is the second main surface S2 of the L/M chip 2A are joined via an adhesive 5. Thereby, the stacked chip 3 (hereinafter, referred to as a "stacked chip 3A") according to the third embodiment in which the pixel chip 1A and the L/M chip 2A are stacked one on another is configured. Note that, in the third embodiment, a joining portion C1 on the pixel chip 1A side and a joining portion C2 on the L/M chip 2A side are formed via the adhesive 5.

In the third embodiment, the adhesive 5 includes a resin material, for example. Examples of the resin material include, for example, a BCB (Benzocyclobutene (benzocyclobutene)) resin, a Polyimide (polyimide) resin, a Benzoxazole (benzoxazole) resin, a Polyarylene (polyarylen) resin, and the like. These resin materials have mutually different physical property values, and an appropriate one is selected according to processes following joining. Here, a property that is deemed to be important as a property of an adhesive used for joining semiconductor chips are a heat-proof temperature that the adhesive can withstand in relation to thermal histories of processes following a joining step, a degassing property mainly at the time of cross-linking, kinetic viscosity, an application film thickness, and the like. These are directly related to the product yield.

Hereinafter, on the basis of FIGS. 13A, 13B, 13C and 13D, one example of a method of manufacturing the stacked chip 3A of the third embodiment is explained in order of steps.

Figure 13B:
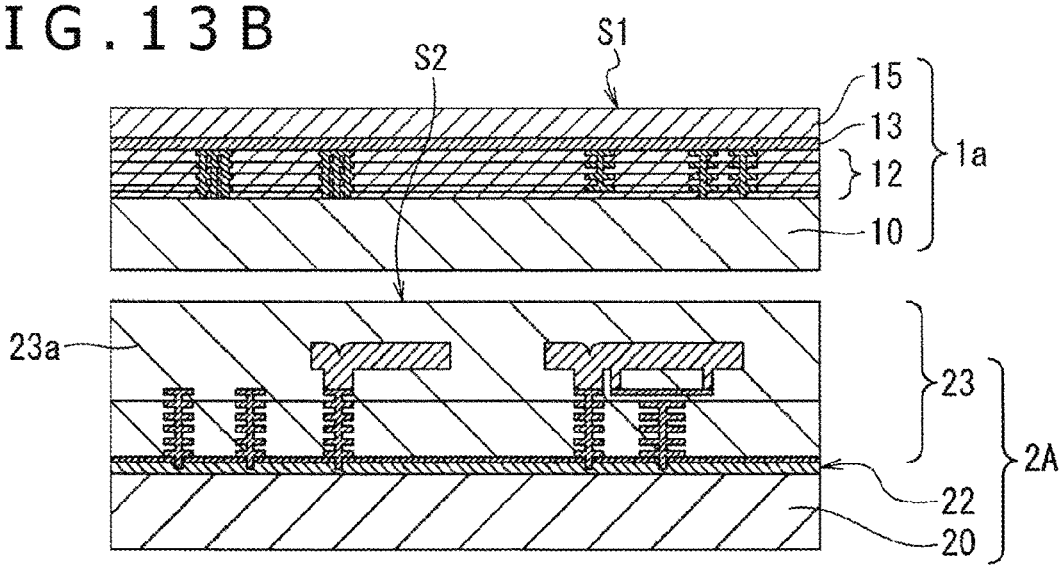
FIG. 13B is a cross-sectional view depicting a method of manufacturing the solid-state image pickup apparatus according to the third embodiment of the present disclosure in order of steps.
Figure 13C:
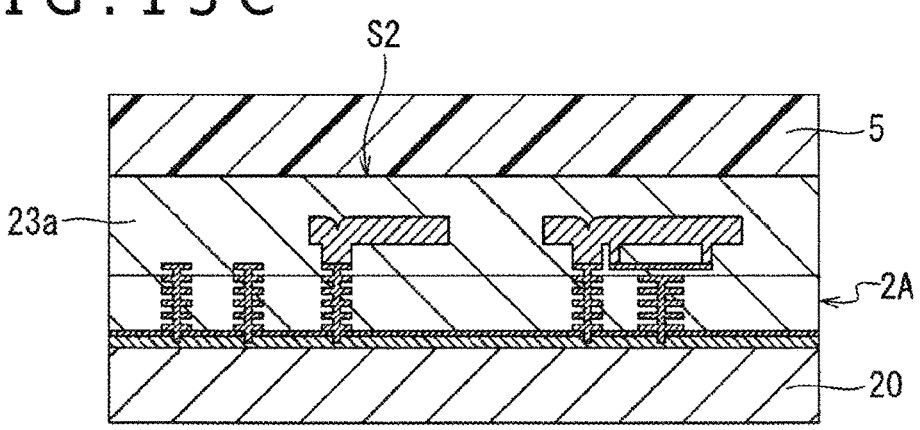
FIG. 13C is a cross-sectional view depicting the method of manufacturing the solid-state image pickup apparatus according to the third embodiment in order of steps.

As depicted in FIG. 13A, the pixel section 1a which are provided and the L/M chip 2A with the configurations described above are manufactured by a well-known manufacturing method. Thereafter, as depicted in FIG. 13B, the process proceeds to a joining step, and, by using an applying apparatus, the paste resin adhesive 5 is applied entirely uniformly onto the second main surface S2 (the upper end surface in FIG. 13C) which is the junction surface of the silicon oxide film 23a of the L/M chip 2A. The application method is not particularly limited, and, for example, the adhesive 5 can be applied by using a dispenser having a syringe to which a fine nozzle is attached, or the like.

Figure 13D:
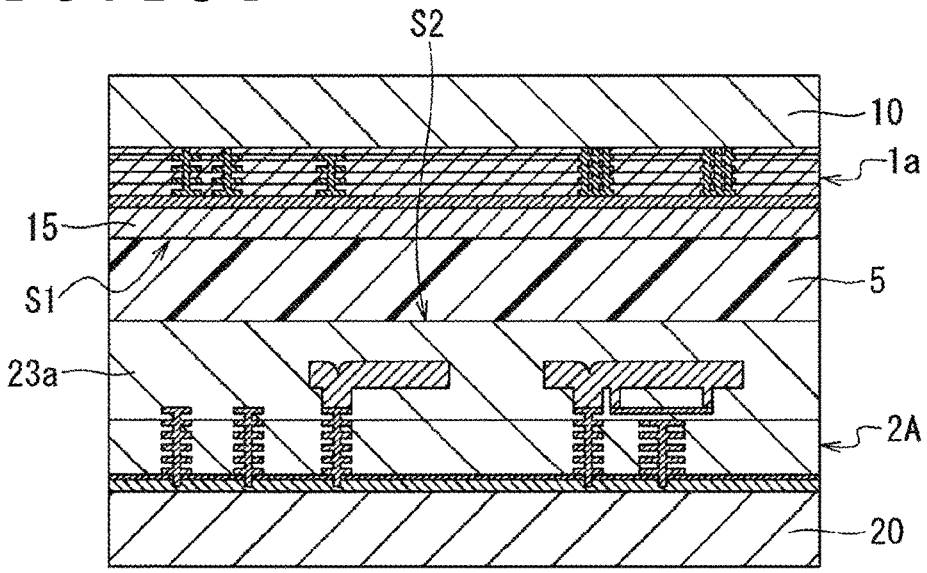
FIG. 13D is a cross-sectional view depicting the method of manufacturing the solid-state image pickup apparatus according to the third embodiment in order of steps.

Subsequently, as depicted in FIG. 13D, by using a bonding apparatus, the first main surface S1 (the lower end surface in FIG. 13D) which is the junction surface of the silicon oxide film 15 of the pixel section 1a is placed on the application surface of the adhesive 5 of the L/M chip 2A, and is compression-bonded therewith. Next, by using a drying apparatus, the adhesive 5 is heated at a temperature and for a length of time that are necessary for adhesion (curing), and is cured, to thereby complete joining. The method of drying the adhesive 5 is not particularly limited. For example, hot air at 70 to 80° C. is fed to the adhesive 5 for a predetermined length of time, then the adhesive 5 is heated at 150° C. to 220° C. for a predetermined length of time, and thereby the adhesive 5 can be cured. That is, in the joining step, a high temperature process at 350° C. to 400° C. is not required, unlike the first and second embodiments described above.

Next, as depicted in FIG. 13A, the lens section 1b is formed on the backside 10B of the first semiconductor substrate 10 by a well-known method. Thereby, the stacked chip 3A is formed.

Note that, although not depicted in figures, and not explained in relation to the steps described above, an electrical connection is established between the chips of the stacked chip 3 before the formation of the lens section 1b. Examples of the method for the connection include, for example, a method in which a connection is established inside the chips by a through silicon electrode (TSV), the method mentioned above in which a connection is established via a joining portion by Cu—Cu joining, and the like.

Figure 14:
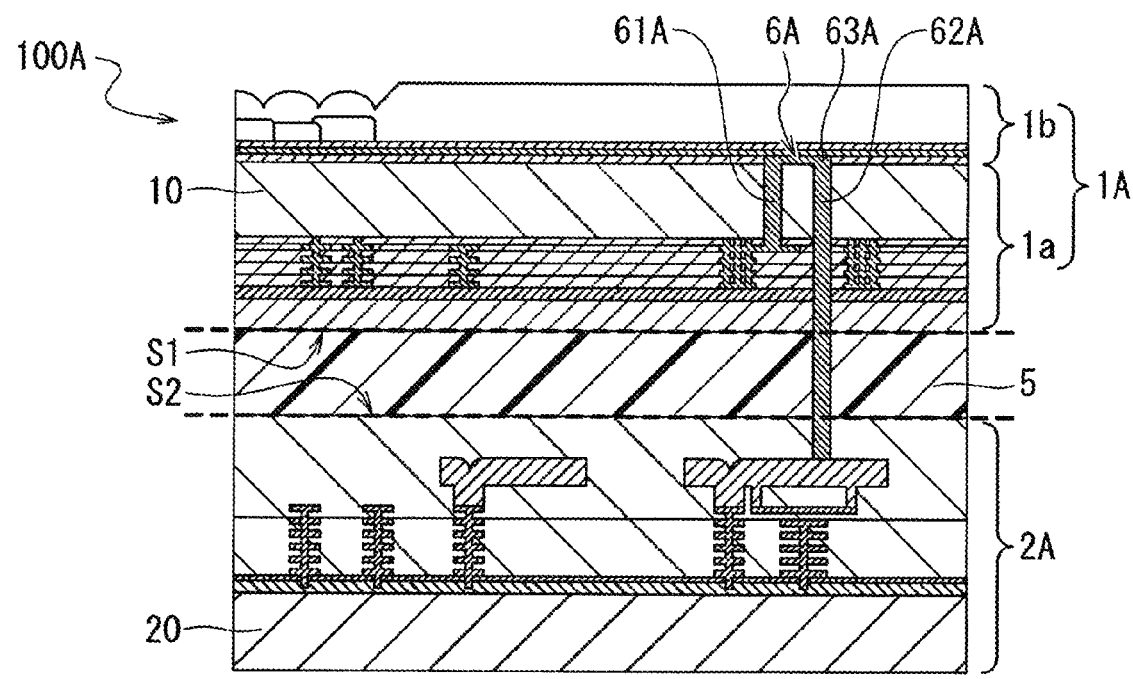
FIG. 14 is a cross-sectional view depicting a configuration example in a case that an electrical connection is established between chips by using a twin-contact type TSV in the solid-state image pickup apparatus according to the third embodiment.

Here, in the solid-state image pickup apparatus 100A of the third embodiment, a connection is established by using a TSV. Specifically, as depicted in FIG. 14, signal lines, and power lines formed in the multilayer wiring layers 12 and 23 included in the pixel chip 1A and the L/M chip 2A, respectively, are electrically connected by a twin-contact type TSV 6A.

This TSV 6A is formed by a well-known method, and has a first through electrode 61A that penetrates the first semiconductor substrate 10 from the upper front surface of the pixel section 1a of the pixel chip 1A, and reaches the multilayer wiring layer 12. Additionally, the TSV 6A has a second through electrode 62A that penetrates the first semiconductor substrate 10 and the multilayer wiring layer 12 from the upper front surface of the pixel section 1a, and reaches the multilayer wiring layer 23 of the L/M chip 2A. Furthermore, the TSV 6A has a through electrode connection wire 63A for connecting the first and second through electrodes 61A and 62A.

In this manner, the signal lines and the power lines formed in the multilayer wiring layers 12 and 23 are electrically connected via the two through electrodes (the first through electrode 61A and the second through electrode 62A).

Note that each through electrode of the TSV 6A is formed by a manufacturing method similar to that for the conductive via 213 described above. In addition, while the creation of the TSV 6A is performed after the stacking of the chips in the example explained, this example is not the sole example, and the TSV 6A may be created at another timing such as a timing after the creation of the pixel chip 1A and the L/M chip 2A, or a timing during the creation of the multilayer wiring layers.

As explained above, in the solid-state image pickup apparatus 100A according to the third embodiment of the present disclosure, the pixel chip 1A has the plurality of pixel transistors that are included in the pixel region 103, the multilayer wiring layer 12, and the interlayer dielectric film 15 for joining, the plurality of pixel transistors and the multilayer wiring layer 12 being formed on the first main surface S1 side of the pixel chip 1A which is one surface of the pixel chip 1A, the interlayer dielectric film 15 for joining being formed on a layer above the plurality of pixel transistors and the multilayer wiring layer 12. Additionally, the logic memory chip 2A has the logic circuit section 200 and the memory section 210, the multilayer wiring layer 23, and the interlayer dielectric film 23a for joining, the logic circuit section 200 and the memory section 210, and the multilayer wiring layer 23 being formed on the second main surface S2 side of the logic memory chip 2A which is one surface side of the logic memory chip 2A, the interlayer dielectric film 23a for joining being formed on a layer above the logic circuit section 200 and the memory section 210 and the multilayer wiring layer 23. Furthermore, the pixel chip 1A, and the logic memory chip 2A are stacked one on another by joining the end surfaces of the interlayer dielectric films 15 and 23a which are the first and second main surfaces S1 and S2 via the resin adhesive 5.

According to this configuration, because the pixel chip 1A and the logic memory chip 2A are joined by the adhesive 5, they can be joined by a low temperature process in the joining step as compared to a case that they are joined by using plasma joining. Thereby, because it becomes possible to suppress generation of active hydrogen from the interlayer dielectric films, it becomes possible to prevent or reduce entrance of active hydrogen to the MTJ element 8.

In addition, in the solid-state image pickup apparatus 100A according to the third embodiment of the present disclosure, only the oxide films are formed as the interlayer dielectric films on a side of the pixel chip 1A closer to the L/M chip 2A relative to the multilayer wiring layer 12, and on a side of the L/M chip 2A closer to the pixel chip 1A relative to the multilayer wiring layer 23. That is, nitride films such as silicon nitride films for adjusting warping of the chips are not formed on the side of the pixel chip 1A closer to the L/M chip 2A relative to the multilayer wiring layer 12, and on the side of the L/M chip 2A closer to the pixel chip 1A relative to the multilayer wiring layer 23.

According to this configuration, it becomes possible to prevent occurrence of the high temperature steam cross link phenomenon itself that is particularly caused by silicon nitride films for warp adjustment, and it becomes possible to further suppress generation of active hydrogen. In addition, by using the adhesive 5 for joining, it becomes possible to absorb warping of the chips that occurs because there are no silicon nitride films for warp adjustment, and it becomes possible to ensure the flatness.

In addition, in the solid-state image pickup apparatus 100A according to the third embodiment of the present disclosure, the adhesive 5 described above includes at least one type of resin selected from a BCB resin, a polyimide resin, a benzoxazole resin, and a polyarylene resin.

According to this configuration, because joining is performed by using the adhesive including any one type of resin material described above, it becomes possible to form a joining portion that is favorable in terms of a heat-resistant property, a degassing property, kinetic viscosity, a thin film property, and the like. Thereby, it is possible to perform good joining in the joining step, and also it is possible to prevent the joint strength from being impaired in relation to thermal histories that occur at steps after the joining step. For example, a BCB resin has high heat resistance, and can be cured by a polymerization reaction that involves only heat. Accordingly, a catalyst and an initiator are not necessary, and the amount of impurities that may otherwise be generated from them also is small. In addition, because there is no occurrence of a volatile matter at the time of heating-curing, for example, no occurrence of condensed water like the one that is seen at the time of curing of polyimide, it is not necessary to be concerned about corrosion of wire materials, and the like.

In addition, in the solid-state image pickup apparatus 100A according to the third embodiment of the present disclosure, the multilayer wire 12b of the multilayer wiring layer 12 in the pixel chip 1A, and the multilayer wire 23b of the multilayer wiring layer 23 in the L/M chip 2A are electrically connected via the twin-contact type TSV (through electrode) 6A.

According to this configuration, because the chips are electrically connected by the TSV 6A, it becomes possible to enhance the degree of freedom of arrangement of the MTJ element 8. Additionally, it becomes possible to fabricate the stacked chip 3A and eventually, the solid-state image pickup apparatus 100A in which the property of the MTJ element 8 that is arranged flexibly do not deteriorate.

First Modification Example of Third Embodiment

In the configuration explained in the third embodiment described above, the signal lines and the electrodes of the chips are electrically connected by the twin-contact type TSV 6A. A first modification example of the third embodiment is different from the third embodiment described above in that they are connected by a shared-contact type TSV.

Figure 15:
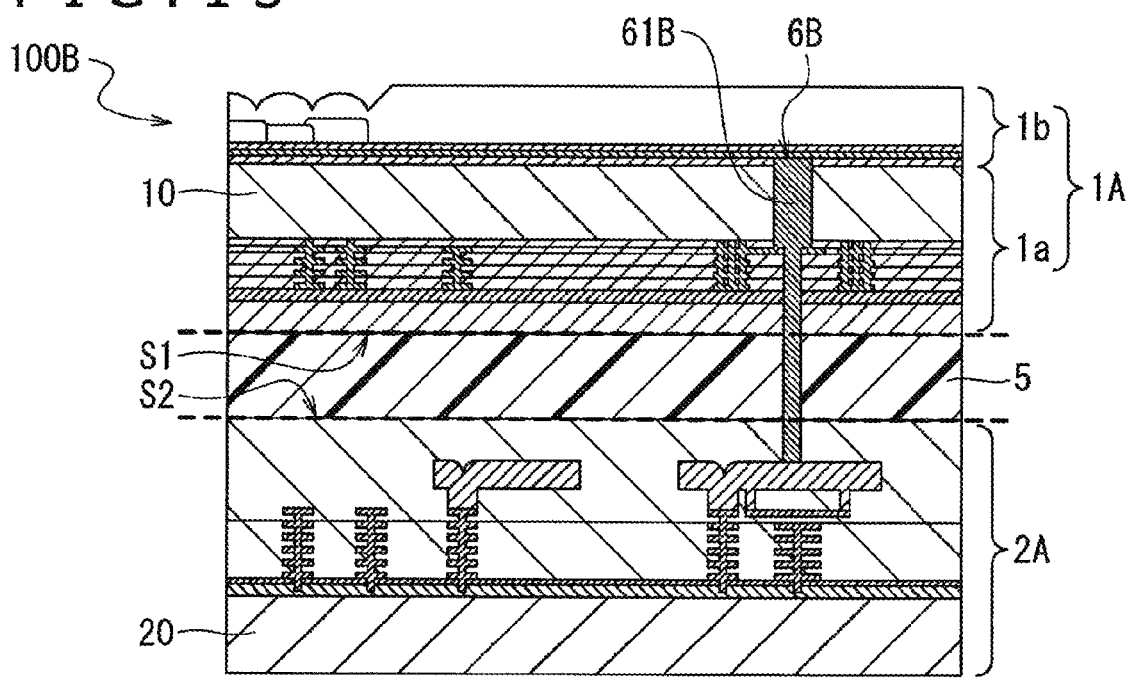
FIG. 15 is a cross-sectional view depicting a configuration example of a solid-state image pickup apparatus according to a first modification example of the third embodiment.

That is, in a solid-state image pickup apparatus 100B according to the first modification example, as depicted in FIG. 15, signal lines, and power lines formed in the multilayer wiring layers 12 and 23 included in the pixel chip 1A, and the L/M chip 2A, respectively, are electrically connected by a shared-contact type TSV 6B.

The shared-contact type TSV 6B has one through electrode 61B that is provided to penetrate the first semiconductor substrate 10 from the front surface of the pixel section 1a in the pixel chip 1A, penetrate the multilayer wiring layer 12 while being conductive with part of the multilayer wire 12b thereof, furthermore reach the multilayer wiring layer 23 of the L/M chip 2A, and become conductive with part of the multilayer wire 23b. Furthermore, the through electrode 61B in the first modification example has a structure in which a conductive material is embedded in a through hole. That is, the through electrode 61B forms a through hole that penetrates the multilayer wire 12b of the pixel chip 1A while making part of the multilayer wire 12b exposed, furthermore reaches the multilayer wiring layer 23 of the L/M chip 2A, and penetrates the multilayer wire 23b such that the through hole makes part of the multilayer wire 23b exposed. Then, the through electrode 61B is formed by embedding a conductive material (e.g. Cu, etc.) in the through hole. Note that this configuration is not the sole example, and the through electrode 61B may have a structure in which a conductive material is formed on the inner wall of the through hole.

In this manner, the multilayer wiring layers of the pixel chip 1A and the L/M chip 2A share the one common through electrode 61B, and the signal lines, and the power lines formed in the pixel chip 1A and the L/M chip 2A are electrically connected thereby. Hereinafter, the stacked chip 3 formed by stacking the pixel chip 1A and the L/M chip 2A with the configurations is referred to as a "stacked chip 3B."

According to this configuration, because the chips are electrically connected by the TSV 6B, it becomes possible to enhance the degree of freedom of arrangement of the MTJ element 8. Additionally, it becomes possible to fabricate the stacked chip 3B and eventually the solid-state image pickup apparatus 100B in which the property of the MTJ element 8 that is arranged flexibly do not deteriorate.

Second Modification Example of Third Embodiment

In the configuration explained in the third embodiment described above, in both the pixel chip 1A, and the L/M chip 2A, only the oxide films are formed as the interlayer dielectric films on the side closer to the L/M chip 2A relative to the multilayer wiring layer 12, and on the side closer to the pixel chip 1A relative to the multilayer wiring layer 23. That is, in the configuration explained, nitride films including silicon nitride films for warp adjustment of the chips are not provided on the side closer to the L/M chip 2A relative to the multilayer wiring layer 12, and on the side closer to the pixel chip 1A relative to the multilayer wiring layer 23. The configuration of a second modification example of the third embodiment is different from the configuration of the third embodiment described above in that the nitride film is not provided only either on the side of the pixel chip 1A closer to the L/M chip 2A relative to the multilayer wiring layer 12, or on the side of the L/M chip 2A closer to the pixel chip 1A relative to the multilayer wiring layer 23.

That is, although not depicted in figures, the configuration of the solid-state image pickup apparatus 100A according to the second modification example corresponds to the configuration depicted in FIG. 14, but is different in that, for example, only the oxide film as the interlayer dielectric film is formed only either on the side of the pixel chip 1A closer to the L/M chip 2A relative to the multilayer wiring layer 12, or on the side of the L/M chip 2A closer to the pixel chip 1A relative to the multilayer wiring layer 23. That is, in the configuration, the nitride film as the interlayer dielectric film is not formed only either on the side of the pixel chip 1A closer to the L/M chip 2 relative to the multilayer wiring layer 12, or on the side of the L/M chip 2A closer to the pixel chip 1 relative to the multilayer wiring layer 23. Additionally, in this configuration, the junction surfaces of the pixel chip 1A and the L/M chip 2A with the configurations described above are joined via the adhesive 5.

According to this configuration, it becomes possible to suppress generation of active hydrogen as compared to the configurations of the pixel chip 1 and the L/M chip 2 in the first and second embodiments. In addition, for example, by providing the silicon nitride film for warp adjustment only on the side of a chip that is to have more significant warping, and so on, it becomes possible to make it easy to adjust warping.

Third Modification Example of Third Embodiment

In the configuration explained in the third embodiment described above, in both the pixel chip 1A and the L/M chip 2A, nitride films such as silicon nitride films for warp adjustment of the chips are not provided on the side closer to the L/M chip 2A relative to the multilayer wiring layer 12, and on the side closer to the pixel chip 1A relative to the multilayer wiring layer 23. That is, in the configuration explained, nitride films including silicon nitride films for warp adjustment of the chips are not provided on the side closer to the L/M chip 2A relative to the multilayer wiring layer 12, and on the side closer to the pixel chip 1A relative to the multilayer wiring layer 23. A third modification example of the third embodiment is different from the third embodiment described above in that the pixel chip 1 and the L/M chip 2 in the first and second embodiments described above are joined via the adhesive 5.

That is, although not depicted in figures, the solid-state image pickup apparatus 100 according to the third modification example has a configuration that corresponds to the configuration depicted in FIG. 3, but is different in that, instead of plasma activation joining, the junction surfaces of the silicon oxide films 15 and 26 of the pixel chip 1 and the L/M chip 2 are joined via the adhesive 5.

According to this configuration, because it becomes possible to perform joining at a low temperature process as compared with plasma activation joining, it becomes possible to suppress occurrence of the high temperature steam cross link phenomenon. Thereby, it becomes possible to suppress generation of active hydrogen, and to reduce the amount of active hydrogen that reaches the MTJ element 8.

Fourth Modification Example of Third Embodiment

The configuration of the memory section 210 explained in the third embodiment described above corresponds to the configuration of the memory section 210 in the first and second embodiments described above, but is different in that nitride films such as silicon nitride films for warp adjustment of the chips are not provided on a side closer to the L/M chip 2 relative to the multilayer wiring layer 12, and on a side closer to the pixel chip 1 relative to the multilayer wiring layer 23. Then, in the configuration explained, the pixel chip 1A and the L/M chip 2A with the configurations described above are joined via the adhesive 5. For example, in the configuration explained, in a case that the configuration of the first embodiment described above is adopted, the nitride films are removed from the configuration in which the upper protective film 4T and the side protective film 4S are provided on the top surface and side surface of the MTJ element 8, and joining is performed via the adhesive 5. A fourth modification example of the third embodiment is different from the third embodiment described above in that the configuration of the third embodiment described above is applied to a configuration in which a protective film is not provided to at least one of the top surface and side surface of the MTJ element 8.

That is, the configuration of the memory section 210 in the fourth modification example corresponds to the configuration of the memory section 210 in the third embodiment described above, but is different in that the configuration of memory cells is the configuration depicted in FIG. 8A, for example. Specifically, in this configuration, a protective film is not formed on both the top surface and side surface of the MTJ element 8.

According to this configuration, a metal film or a silicon nitride film cannot be used for protection, but it becomes possible to perform joining by a low temperature process as compared to a conventional configuration in which plasma activation joining is performed. Accordingly, it becomes possible to suppress generation of active hydrogen, and it becomes possible to reduce entrance of atoms and molecules such as active hydrogen that have a negative influence to the MTJ element 8 as compared with a configuration having a silicon nitride film for warp adjustment, and with a case that plasma activation joining is used.

Fourth Embodiment

The configuration explained in the third embodiment described above corresponds to the configuration of the first or second embodiment described above, but is different in that the junction surfaces of the interlayer dielectric films 15 and 23a of the pixel chip 1A and the L/M chip 2A having the configurations in which only the oxide films as the interlayer dielectric films are formed on a side of the pixel chip 1 closer to the L/M chip 2 relative to the multilayer wiring layer 12, and on a side of the L/M chip 2A closer to the pixel chip 1 relative to the multilayer wiring layer 23 are joined via the adhesive 5. The fourth embodiment is different from the third embodiment described above in that, in addition to the joining by the adhesive 5, direct joining between metal electrodes also is performed.

Hereinafter, constituent sections similar to those in the third embodiment described above are given similar reference signs, explanations thereof are omitted as appropriate, and differences are explained in detail.

Figure 16A:
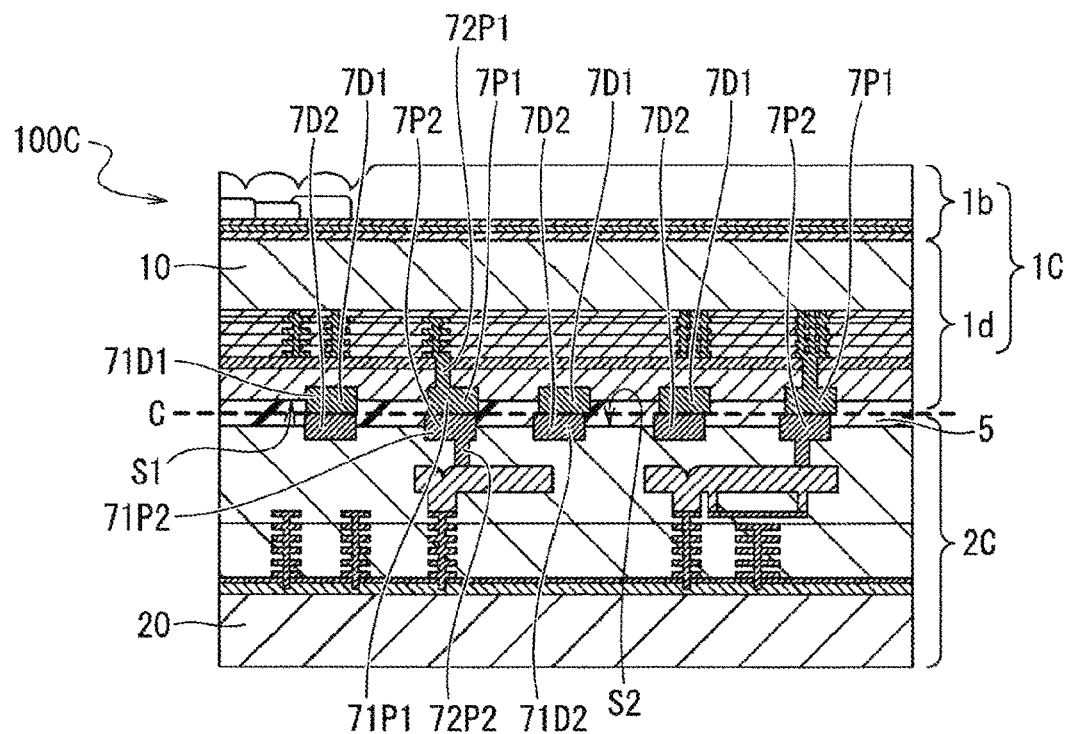
FIG. 16A is a cross-sectional view depicting a configuration example of a solid-state image pickup apparatus according to a fourth embodiment of the present disclosure.

A solid-state image pickup apparatus 100C according to the fourth embodiment includes a pixel chip 1C and an L/M chip 2C as depicted in FIG. 16A.

The pixel chip 1C according to the fourth embodiment includes a pixel section 1d and the lens section 1b. The pixel section 1d has a configuration that corresponds to the configuration of the pixel section 1a in the third embodiment described above, but is different in that it includes a plurality of metal electrodes 7P1 and a plurality of dummy electrodes 7D1 that are provided on the silicon oxide film 15.

Each metal electrode 7P1 includes a metal electrode pad 71P1 to function as a joining portion, and a metal electrode via 72P1 that extends from the metal electrode pad 71P1 and that is connected to the multilayer wire 12b. Each dummy electrode 7D1 includes a metal electrode pad 71D1 to function as a joining portion. Then, the plurality of metal electrodes 7P1 and the plurality of dummy electrodes 7D1 are provided such that at least part of the metal electrode pads 71P1 and 71D1 including pad surfaces (junction surfaces) are exposed at a junction-side surface of the silicon oxide film 15.

The L/M chip 2C has a configuration that corresponds to the configuration of the L/M chip 2A in the third embodiment described above, but is different in that it includes a plurality of metal electrodes 7P2 and a plurality of dummy electrodes 7D2 that are provided on the silicon oxide film 23a.

Each metal electrode 7P2 includes a metal electrode pad 71P2 to function as a joining portion, and a metal electrode via 72P2 that extends from the metal electrode pad 71P2 and that is connected to the multilayer wire 23b. Each dummy electrode 7D2 includes a metal electrode pad 71D2 to function as a joining portion. Then, the plurality of metal electrodes 7P2 and the plurality of dummy electrodes 7D2 are provided such that at least part of the metal electrode pads 71P2 and 71D2 including pad surfaces (junction surfaces) are exposed at a junction-side surface of the silicon oxide film 23a.

Note that the metal electrodes 7P1 and 7P2 include electrically conductive metal materials suited for direct joining. Examples of the metal materials include Cu, Au, Al, and the like, for example. It is assumed in the fourth embodiment that they include Cu.

The dummy electrodes 7D1 and 7D2 include materials similar to those of the metal electrodes 7P1 and 7P2 and have configurations including only metal electrode pads. That is, the dummy electrodes 7D1 and 7D2 are dummy metal electrodes for enhancing the joint strength, but do not have the roles of electrodes.

In addition, the metal electrodes 7P1 and 7P2, and the dummy electrodes 7D1 and 7D2 form pairs, and a plurality of pairs of these is provided. Furthermore, the metal electrodes 7P1 and 7P2 and the dummy electrodes 7D1 and 7D2 forming pairs are provided at positions at which pad surfaces thereof at least partially face each other at the time of joining.

In addition, the metal electrodes 7P1 and 7P2 are formed by the single damascene method or the dual damascene method, for example, and the dummy electrodes 7D1 and 7D2 are formed by the single damascene method, for example.

Hereinafter, in a case that it is not necessary to make distinctions between the metal electrodes 7P1 and 7P2 and the dummy electrodes 7D1 and 7D2, they are simply referred to as "metal electrodes 7."

Then, in the fourth embodiment, the end surface of the silicon oxide film 15 which is the first main surface S1 of the pixel chip 1C, and the pad surfaces of the metal electrodes 7P1 and the dummy electrodes 7D1, and the end surface of the silicon oxide film 23a which is the second main surface S2 of the L/M chip 2C, and the pad surfaces of the metal electrodes 7P2 and the dummy electrodes 7D2 are joined. Specifically, ones that form pair, and that face each other in the metal electrodes 7P1 and the dummy electrodes 7D1, and the metal electrodes 7P2 and the dummy electrodes 7D2 are rigidly joined by direct joining. Furthermore, portions that are between these electrodes and at which the silicon oxide film 15 and the silicon oxide film 23a face each other are joined via the adhesive 5. Thereby, the stacked chip 3 (hereinafter, referred to as a "stacked chip 3C") according to the fourth embodiment in which the pixel chip 1C and the L/M chip 2C are stacked one on another is configured.

Hereinafter, on the basis of FIGS. 16A, 16B, 16C, and 16D, one example of a method of manufacturing the stacked chip 3C of the fourth embodiment is explained in order of steps.

Figure 16B:
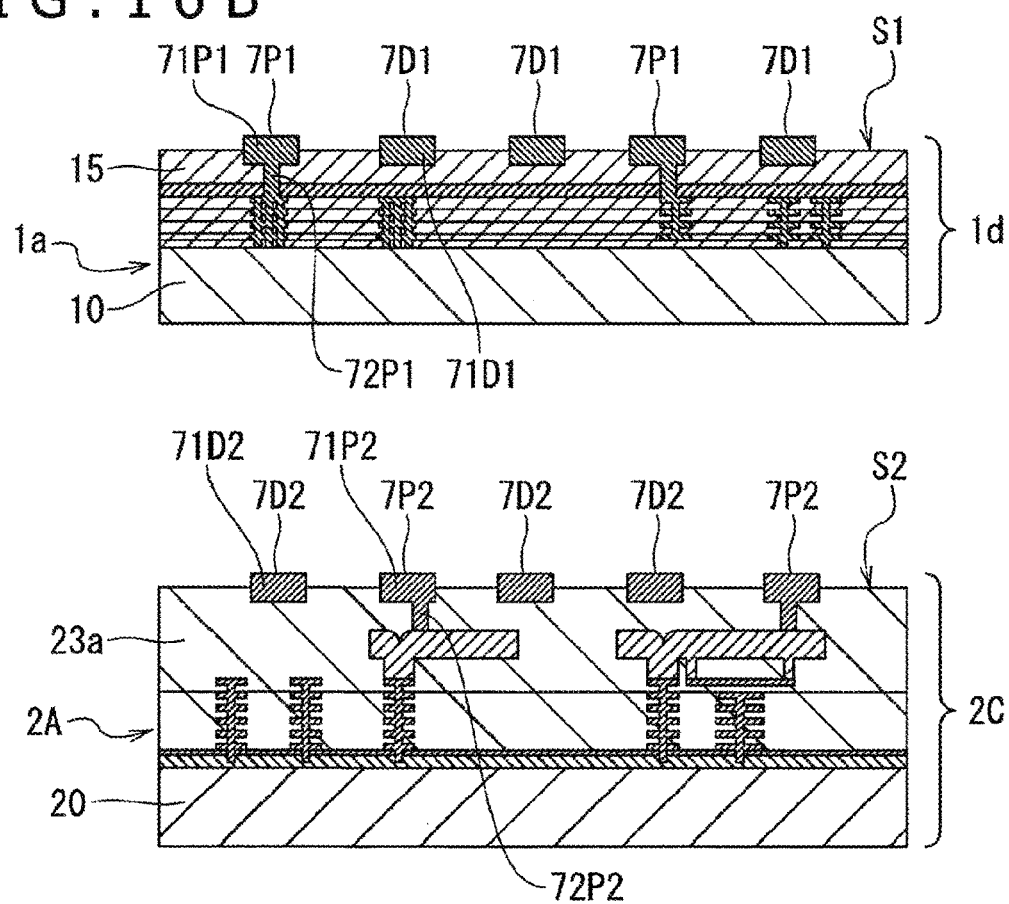
FIG. 16B is a cross-sectional view depicting a method of manufacturing the solid-state image pickup apparatus according to the fourth embodiment of the present disclosure in order of steps.
Figure 16C:
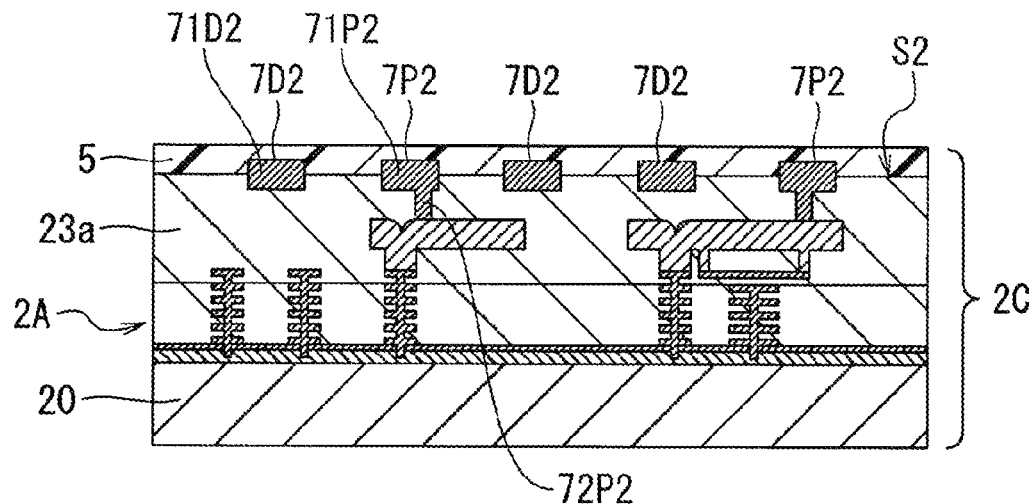
FIG. 16C is a cross-sectional view depicting the method of manufacturing the solid-state image pickup apparatus according to the fourth embodiment in order of steps.

As depicted in FIG. 16B, the pixel section 1d and the L/M chip 2C with the configurations described above are manufactured by a well-known manufacturing method. Thereafter, the process proceeds to a joining step, and as depicted in FIG. 16C, by an applying apparatus, the adhesive 5 is applied entirely uniformly onto the second main surface S2 (the upper end surface in FIG. 16C) which is the junction surfaces of the silicon oxide film 23a and the metal electrodes 7P2 and the dummy electrodes 7D2 of the L/M chip 2C.

Figure 16D:
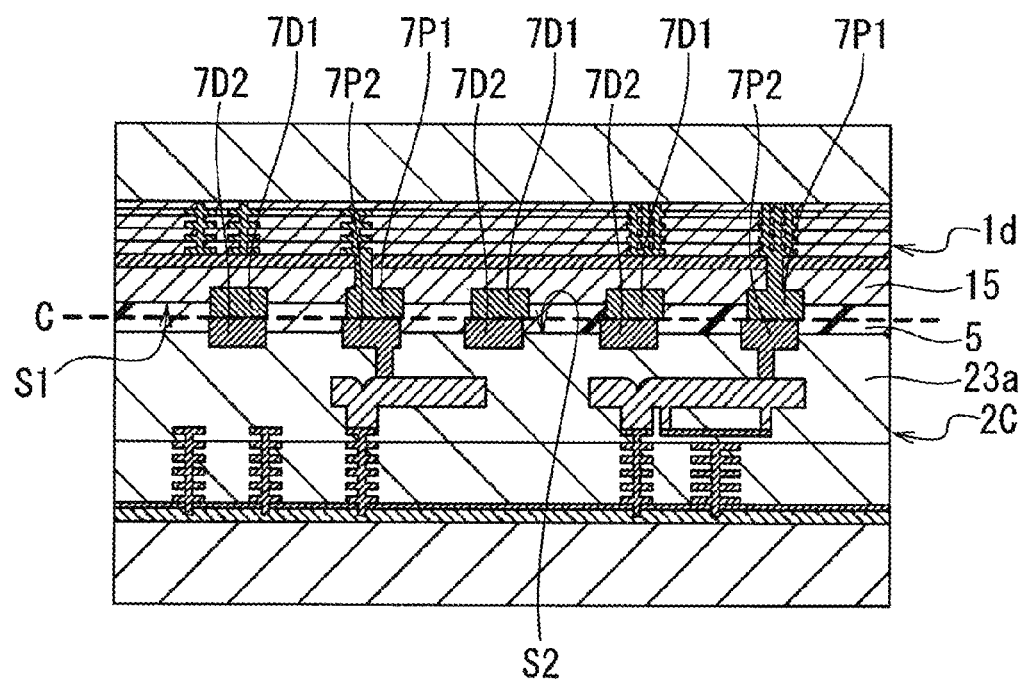
FIG. 16D is a cross-sectional view depicting the method of manufacturing the solid-state image pickup apparatus according to the fourth embodiment in order of steps.
Figure 17:
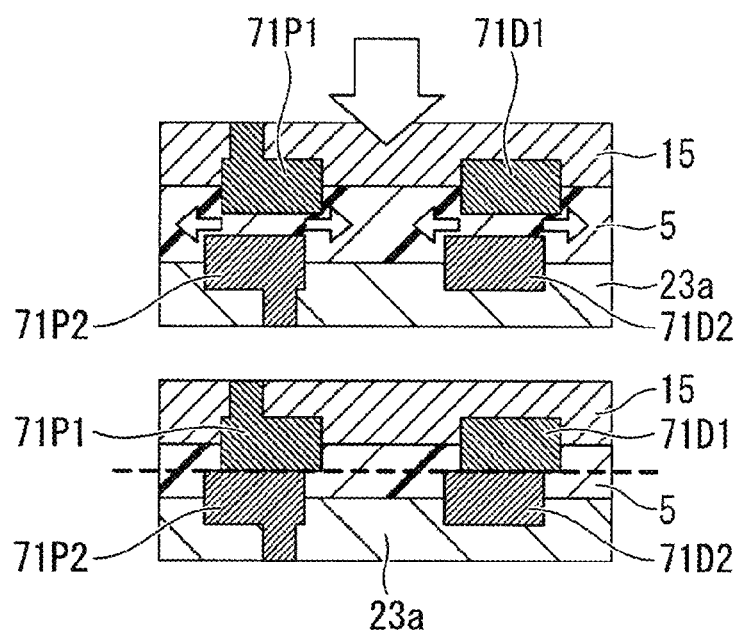
FIG. 17 is a cross-sectional view depicting a configuration example of metal electrode pads according to the fourth embodiment.

Subsequently, as depicted in FIG. 16D, by using the bonding apparatus, the first main surface S1 (the lower end surface in FIG. 16D) which is the junction surfaces of the silicon oxide film 15 and the metal electrodes 7P1 and the dummy electrodes 7D1 of the pixel section 1d is placed on the application surface of the adhesive 5 of the L/M chip 2C, and is compression-bonded therewith. That is, as depicted in FIG. 17, direct joining between the metal electrode pads 71P1 and 71P2, and the metal electrode pads 71D1 and 71D2 forming pairs is performed by extruding externally the adhesive 5 that is present between the metal electrode pads 71P1 and 71P2, and the metal electrode pads 71D1 and 71D2 forming the pairs by pressure generated at the time of joining. Note that, in the fourth embodiment, joining between the metal electrodes 7 is performed at a relatively low temperature such as normal temperature.

Next, by using a drying apparatus, the adhesive 5 is heated at a temperature and for a length of time that are necessary for adhesion (curing), and is cured, to thereby complete joining. Next, as depicted in FIG. 16A, the lens section 1b is formed on the backside 10B of the first semiconductor substrate 10 by a well-known method. Thereby, the stacked chip 3C is formed.

As explained above, in the solid-state image pickup apparatus 100C according to the fourth embodiment of the present disclosure, the pixel chip 10 has the plurality of pixel transistors that are included in the pixel region 103, the multilayer wiring layer 12, and the interlayer dielectric film (silicon oxide film) 15 for joining, the plurality of pixel transistors and the multilayer wiring layer 12 being formed on the first main surface S1 side of the pixel chip 10 which is one surface of the pixel chip 10, the interlayer dielectric film 15 for joining being formed on a layer above the plurality of pixel transistors and the multilayer wiring layer 12. Additionally, the logic memory chip 2A has the logic circuit section 200 and the memory section 210, the multilayer wiring layer 23, and the interlayer dielectric film (silicon oxide film) 23a for joining, the logic circuit section 200 and the memory section 210 and the multilayer wiring layer 23 being formed on the second main surface S2 side of the logic memory chip 2A which is one surface side of the logic memory chip 2A, the interlayer dielectric film 23a for joining being formed on a layer above the logic circuit section 200 and the memory section 210, and the multilayer wiring layer 23. Furthermore, the silicon oxide film 15 has the plurality of metal electrodes 7P1 that is provided such that part thereof including at least the pad surfaces is exposed to the side of the junction surface. Furthermore, the silicon oxide film 23a has, at positions facing the pad surfaces of the metal electrodes 7P1, the plurality of metal electrodes 7P2 that is provided such that part thereof including at least the pad surfaces is exposed to the side of the junction surface. Furthermore, the metal electrodes 7 (the junction surfaces of the metal electrode pads 71P1 and 71P2 forming pairs) that face each other between the pixel chip 1C and the L/M chip 2C are joined directly, and the silicon oxide films 15 and 23a are joined via the adhesive 5.

According to this configuration, because, in addition to the joining of the silicon oxide films 15 and 23a by the adhesive 5, the metal electrodes 7P1 and 7P2 are joined directly, it becomes possible to enhance the joint strength. Additionally, because it becomes easy to establish a one-to-one connection, for example, between a pixel 102, and an analog-to-digital conversion circuit (not depicted in figures) and a storage element 8 by a connection between the metal electrodes at the junction surfaces, it becomes possible to easily configure a generally-called pixel-ADC solid-state image pickup apparatus in which analog-to-digital conversion is performed for each pixel 102. In addition, due to compression-bonding between the metal electrodes via the adhesive 5, joining by a low temperature process in the joining step becomes possible as compared with a case that plasma joining is used. Thereby, because it becomes possible to suppress generation of active hydrogen from the interlayer dielectric films, it becomes possible to prevent or reduce entrance of active hydrogen to the MTJ element 8.

In addition, in the solid-state image pickup apparatus 100C according to the fourth embodiment of the present disclosure, the silicon oxide film 15 is provided with the plurality of metal electrodes 7P1 having the metal electrode pads 71P1, and the metal electrode vias 72P1. Additionally, the silicon oxide film 15 is provided with the plurality of dummy electrodes 7D1 having the metal electrode pads 71D1. Each of the metal electrodes 7P1 and the dummy electrodes 7D1 is provided such that part thereof including at least the pad surface is exposed at the junction surface of the silicon oxide film 15. Furthermore, the silicon oxide film 23a is provided, at positions facing the plurality of metal electrodes 7P1, with the plurality of metal electrodes 7P2 having the metal electrode pads 71P2 and the metal electrode vias 72P2. Additionally, the silicon oxide film 23a is provided with the plurality of dummy electrodes 7D2 having the metal electrode pads 71D2. Each of the metal electrodes 7P2 and the dummy electrodes 7D2 is provided such that part thereof including at least the pad surface is exposed at the junction surface of the silicon oxide film 23a. Then, the metal electrodes 7 (the junction surfaces of the metal electrode pads 71P1 and 71P2 forming pairs, and the junction surfaces of the metal electrode pads 71D1 and 71D2 forming pairs) that face each other between the pixel chip 1C and the L/M chip 2C are joined directly. Additionally, the junction surfaces of the silicon oxide films 15 and 23a are joined via the adhesive 5 including the resin material.

According to this configuration, because the dummy electrodes 7D1 and 7D2 are provided in addition to the metal electrodes 7P1 and 7P2, and these are also joined directly, it becomes possible to further enhance the joint strength.

In addition, in the solid-state image pickup apparatus 100C according to the fourth embodiment of the present disclosure, only the oxide films are formed as the interlayer dielectric films on a side of the pixel chip 1C closer to the L/M chip 2C relative to the multilayer wiring layer 12, and on a side of the L/M chip 2C closer to the pixel chip 1C relative to the multilayer wiring layer 23. That is, nitride films such as silicon nitride films for adjusting warping of the chips are not formed on the side of the pixel chip 1C closer to the L/M chip 2C relative to the multilayer wiring layer 12, and on the side of the L/M chip 2C closer to the pixel chip 1C relative to the multilayer wiring layer 23.

According to this configuration, it becomes possible to prevent occurrence of the high temperature steam cross link phenomenon itself that is particularly caused by silicon nitride films for warp adjustment, and it becomes possible to further suppress generation of active hydrogen. In addition, by using the adhesive 5 for joining, it becomes possible to absorb warping of the chips that occurs because there are no silicon nitride films for warp adjustment, and it becomes possible to ensure the flatness.

In addition, in the solid-state image pickup apparatus 100C according to the fourth embodiment of the present disclosure, the adhesive 5 described above includes at least one type of resin selected from a BCB resin, a polyimide resin, a benzoxazole resin, and a polyarylene resin.

According to this configuration, because joining is performed by using the adhesive including any one type of resin material described above, it becomes possible to form a joining portion that is favorable in terms of a heat-resistant property, a degassing property, kinetic viscosity, a thin film property, and the like. Thereby, it is possible to perform good joining in the joining step, and also it is possible to prevent the joint strength from being impaired in relation to thermal histories that occur in steps that follow the joining step.

First Modification Example of Fourth Embodiment

In the configuration explained in the fourth embodiment described above, the junction surfaces of the metal electrode pads 71P1 and 71P2 and the metal electrode pads 71D1 and 71D2 of the metal electrodes 7P1 and 7P2 and the dummy electrodes 7D1 and 7D2 forming pairs, respectively, are flat surfaces (see FIG. 17). A first modification example of the fourth embodiment is different from the fourth embodiment described above in that the junction surfaces of the metal electrode pads 71P1 and 71D1 on the side of the pixel chip 1C in the metal electrode pads 71P1 and 71P2 and the metal electrode pads 71D1 and 71D2 of the metal electrodes 7P1 and 7P2 and the dummy electrodes 7D1 and 7D2 forming pairs, respectively, are configured as protruding junction surfaces.

Figure 18:
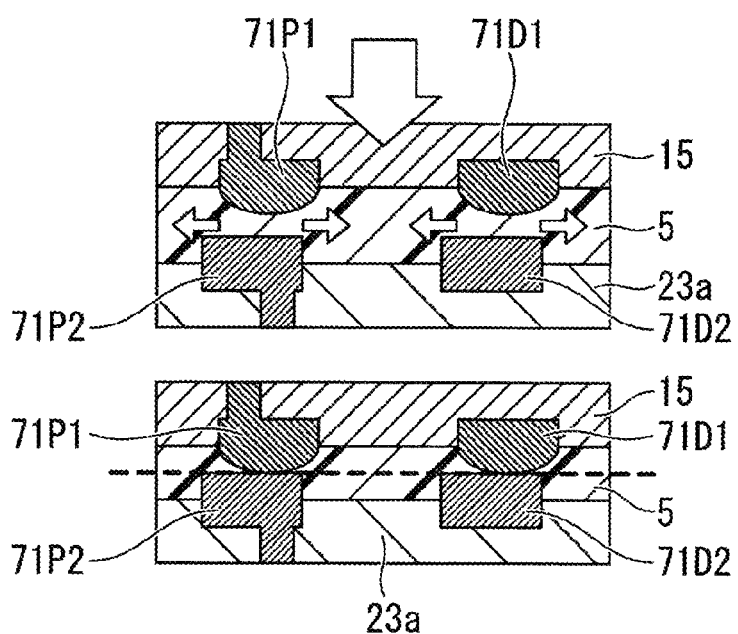
FIG. 18 is a cross-sectional view depicting a configuration example of metal electrode pads according to a first modification example of the fourth embodiment.

That is, in the solid-state image pickup apparatus 100C according to the first modification example, as depicted in FIG. 18, the shapes of the junction surfaces of the metal electrode pads 71P1 and 71D1 of the metal electrodes 7P1 and the dummy electrodes 7D1, respectively, formed on the side of the pixel chip 1C are formed as shapes that protrude toward the joining direction (downward in FIG. 18).

According to this configuration, due to the protruding shapes of the metal electrode pads 71P1 and 71D1 on the side of the pixel chip 1C, it becomes possible to enhance the performance for extruding the adhesive 5 from between the metal electrode pads 71P1 and 71P2, and the metal electrode pads 71D1 and 71D2 at the time of compression bonding. Thereby, it becomes possible to make it easier to directly join the metal electrodes 7 at the time of the compression bonding process, and it becomes possible to make it unnecessary to perform an additional high temperature process.

Second Modification Example of Fourth Embodiment

In the configuration explained in the fourth embodiment described above, the junction surfaces of the metal electrode pads 71P1 and 71P2 and the metal electrode pads 71D1 and 71D2 of the metal electrodes 7P1 and 7P2 and the dummy electrodes 7D1 and 7D2, respectively, forming pairs are flat surfaces. A second modification example of the fourth embodiment is different from the fourth embodiment described above in that the junction surfaces of the respective metal electrode pads 71P2 and 71D2 of the metal electrodes 7P2 and the dummy electrodes 7D2 on the side of the L/M chip 2C in the metal electrode pads 71P1 and 71P2 and the metal electrode pads 71D1 and 71D2 of the metal electrodes 7P1 and 7P2, and the dummy electrodes 7D1 and 7D2, respectively, forming pairs are configured as protruding junction surfaces.

Figure 19:
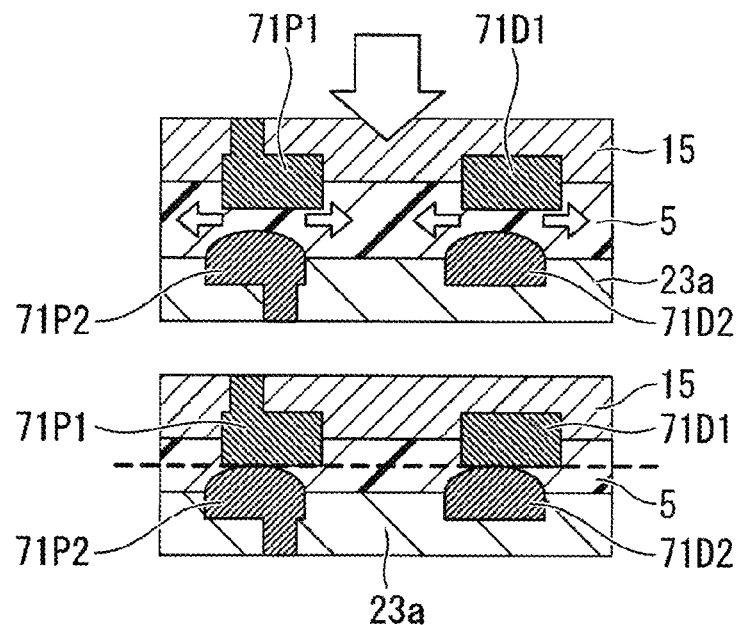
FIG. 19 is a cross-sectional view depicting a configuration example of metal electrode pads according to a second modification example of the fourth embodiment.

That is, in the solid-state image pickup apparatus 100C according to the second modification example, as depicted in FIG. 19, the shapes of the junction surfaces of the metal electrode pads 71P2 and 71D2 of the metal electrodes 7P2 and the dummy electrodes 7D2, respectively, formed on the side of the L/M chip 2C are formed as shapes that protrude toward the joining direction (upward in FIG. 19).

According to this configuration, due to the protruding shapes of the metal electrode pads 71P2 and 71D2 on the side of the L/M chip 2C, it becomes possible to enhance the performance for extruding the adhesive 5 from between the metal electrode pads 71P1 and 71P2 and the metal electrode pads 71D1 and 71D2 at the time of compression bonding. Thereby, it becomes possible to make it easier to directly join the metal electrodes 7 at the time of the compression bonding process, and it becomes possible to make it unnecessary to perform an additional high temperature process.

Third Modification Example of Fourth Embodiment

In the configurations explained in the first and second modification examples of the fourth embodiment described above, the junction surfaces of metal electrode pads 71 on one side in the metal electrode pads 71 of the metal electrodes 7 forming pairs are formed as protruding junction surfaces. A third modification example of the fourth embodiment is different from the first and second modification examples of the fourth embodiment described above in that the junction surfaces of the metal electrode pads 71 of the metal electrodes 7 forming pairs on both sides are configured as protruding conjunction surfaces.

Figure 20:
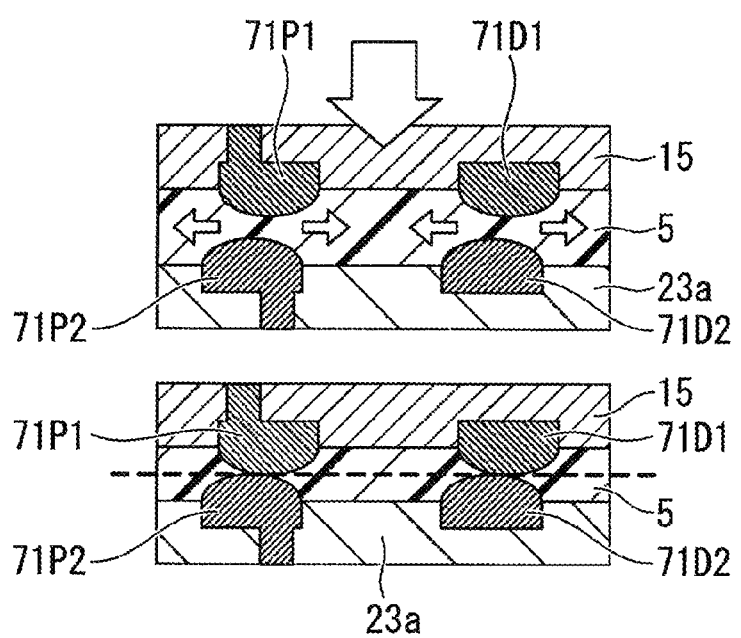
FIG. 20 is a cross-sectional view depicting a configuration example of metal electrode pads according to a third modification example of the fourth embodiment.

That is, in the solid-state image pickup apparatus 100C according to the third modification example, as depicted in FIG. 20, the shapes of the junction surfaces of the metal electrode pads 71P1 and 71D1 formed on the side of the pixel chip 1C are formed as shapes that protrude toward the joining direction (downward in FIG. 20). Additionally, the shapes of the junction surfaces of the metal electrode pads 71P2 and 71D2 formed on the side of the L/M chip 2C are formed as shapes that protrude toward the joining direction (upward in FIG. 20).

According to this configuration, due to the protruding shapes of the junction surfaces of the metal electrode pads 71P1 and 71P2 and the metal electrode pads 71D1 and 71D2 forming pairs on both sides, it becomes possible to further enhance the performance for extruding the adhesive 5 from between the metal electrode pads 71P1 and 71P2, and the metal electrode pads 71D1 and 71D2 at the time of compression bonding. Thereby, it becomes possible to make it easier to directly join the metal electrodes 7 at the time of the compression bonding process, and it becomes possible to make it unnecessary to perform an additional high temperature process.

Fourth Modification Example of Fourth Embodiment

In the configuration explained in the fourth embodiment described above, the junction surfaces of the metal electrodes 7 forming pairs are compression-bonded to be joined directly. A fourth modification example of the fourth embodiment is different from the fourth embodiment described above in that an additional annealing process (high temperature process) is performed after the process of compression bonding of the metal electrodes 7 at a relatively low temperature such as normal temperature.

That is, in the fourth modification example, assuming that there is a case that the adhesive 5 cannot be extruded externally completely from between the metal electrodes 7 forming pairs at the compression bonding process by the bonding apparatus, an annealing process (high temperature process), for example, at 350° C. to 400° C. is performed additionally after the compression bonding process. At that time, control is performed such that a thickness of the adhesive 5 at the time of compression bonding between the metal electrodes 7 forming pairs becomes equal to or smaller than 15 [nm]. By performing control such that the thickness becomes equal to or smaller than 15 [nm], it is possible to realize solid phase diffusion joining between the metal electrodes 7. That is, by the additional heat process, hillock growth of the junction surface of the metal electrodes 7 is facilitated, the metal electrodes 7 are caused to break through the resin layer of the adhesive 5, and solid phase diffusion joining between the metal electrodes 7 is performed. Note that, in a case that the additional high temperature process is performed, the process temperature needs to be set on the basis of the heat-resistant property of the adhesive 5.

With this configuration, it becomes possible to more surely join the metal electrodes 7, and it becomes possible to further enhance the joint strength. In addition, although this accompanies a high temperature process, silicon nitride films for adjusting warping of the chips are not formed in the pixel chip 1C and the L/M chip 2C. Accordingly, there is not occurrence of the high temperature steam cross link phenomenon itself, it becomes possible to suppress generation of active hydrogen, and hydrogen desorption from silicon nitride films also is not generated.

Fifth Embodiment

The configuration explained in the third embodiment described above corresponds to the configuration of the first or second embodiment described above, but is different in that the pixel chip 1A and the L/M chip 2A having the configurations in which only the oxide films as the interlayer dielectric films are formed on the side of the pixel chip 1 closer to the L/M chip 2 relative to the multilayer wiring layer 12, and on the side of the L/M chip 2A closer to the pixel chip 1 relative to the multilayer wiring layer 23 are joined via the adhesive 5. A fifth embodiment has a configuration that corresponds to the configuration of the third embodiment described above, but is different from the configuration of the third embodiment described above in that the silicon oxide films 15 and 23a are joined directly without using the adhesive 5.

Hereinafter, constituent sections similar to those in the third embodiment described above are given similar reference signs, explanations thereof are omitted as appropriate, and differences are explained in detail.

Figure 21A:
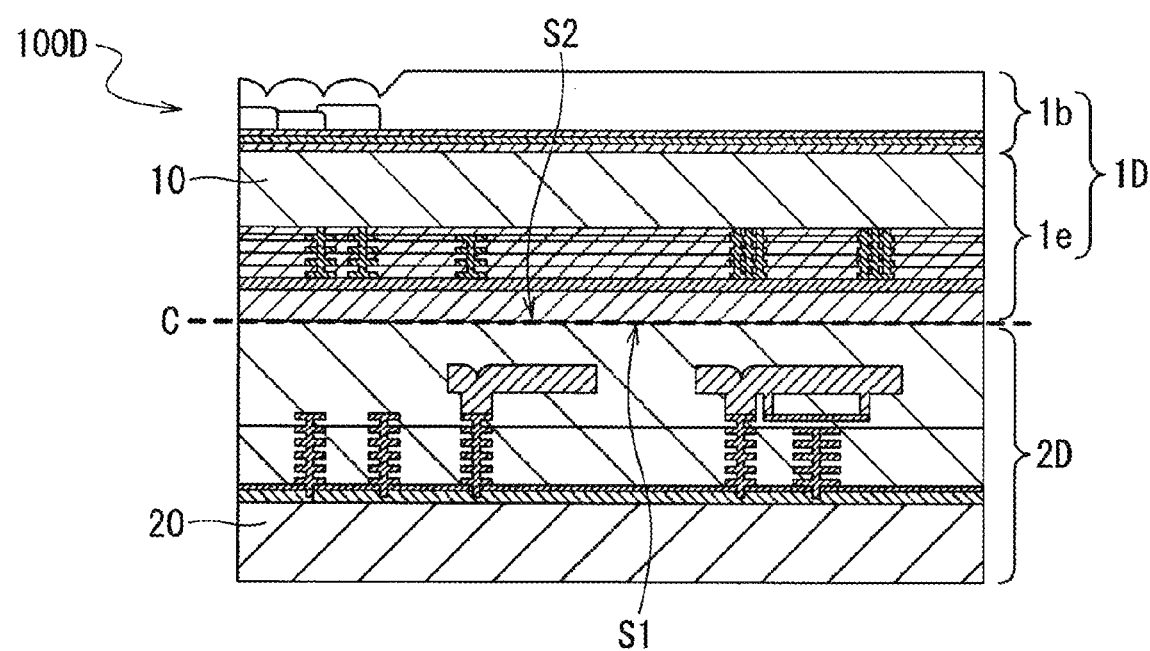
FIG. 21A is a cross-sectional view depicting a configuration example of a solid-state image pickup apparatus according to a fifth embodiment of the present disclosure.

A solid-state image pickup apparatus 100D according to the fifth embodiment includes a pixel chip 1D and an L/M chip 2D as depicted in FIG. 21A.

The pixel chip 1D according to the fifth embodiment includes a pixel section 1e, and the lens section 1b. The pixel section 1e has a configuration that corresponds to the configuration of the pixel section 1a in the third embodiment described above, but is different in that it includes a silicon oxide film 15F instead of the silicon oxide film 15. The L/M chip 2D has a configuration that corresponds to the configuration of the L/M chip 2C in the third embodiment described above, but is different in that it includes a silicon oxide film 23aF instead of the silicon oxide film 23a.

Note that, in the fifth embodiment, the silicon oxide films 15F and 23aF are designed such that they become flat without warping at the time of a BEOL step.

Then, in the fifth embodiment, the end surface of the silicon oxide film 15 which is the first main surface S1 of the pixel chip 1D, and the end surface of the silicon oxide film 23a which is the second main surface S2 of the L/M chip 2D are joined directly. Thereby, the stacked chip 3 (hereinafter, referred to as a "stacked chip 3D") according to the fifth embodiment in which the pixel chip 1D, and the L/M chip 2D are stacked one on another is configured.

Hereinafter, on the basis of FIGS. 21A, 21B, 21C, and 21D, one example of a method of manufacturing the stacked chip 3D of the fifth embodiment is explained in order of steps.

Figure 21B:
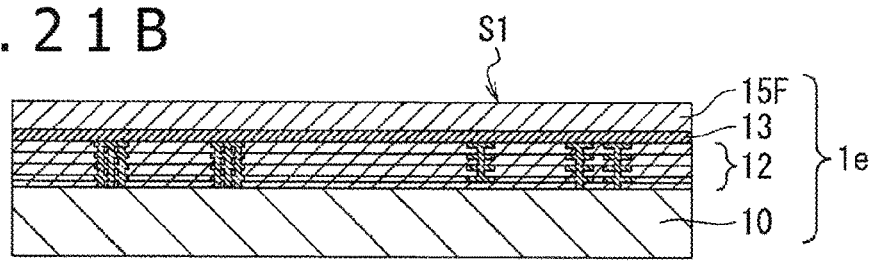
FIG. 21B is a cross-sectional view depicting a method of manufacturing the solid-state image pickup apparatus according to the fifth embodiment of the present disclosure in order of steps.
Figure 21C:
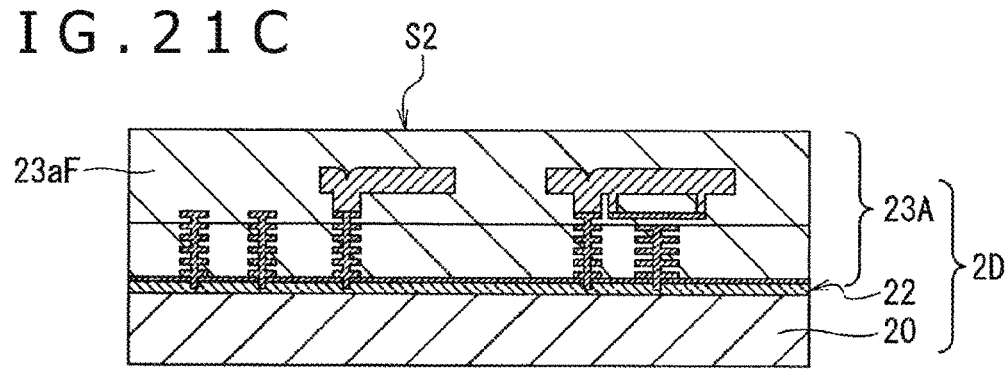
FIG. 21C is a cross-sectional view depicting the method of manufacturing the solid-state image pickup apparatus according to the fifth embodiment in order of steps.
Figure 21D:
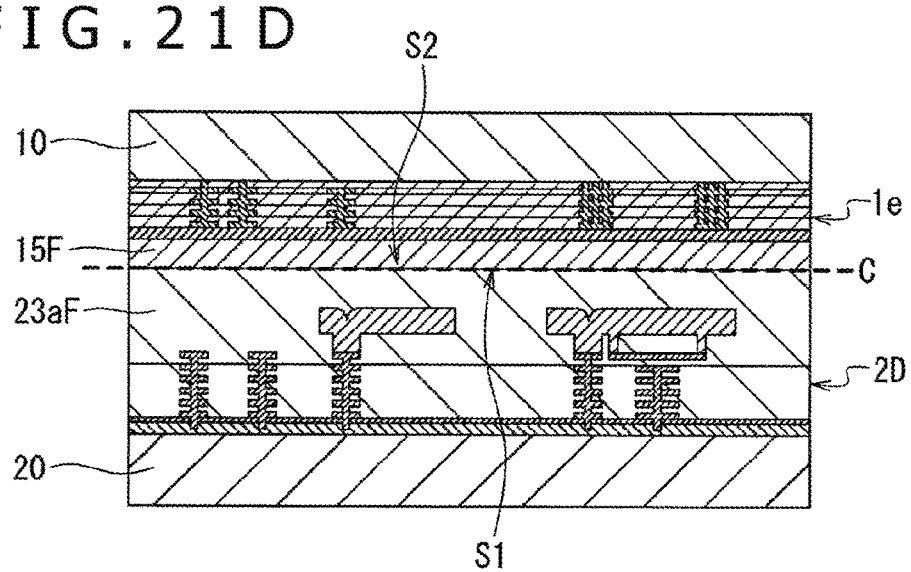
FIG. 21D is a cross-sectional view depicting the method of manufacturing the solid-state image pickup apparatus according to the fifth embodiment in order of steps.

As depicted in FIGS. 21B and 21C, the pixel section 1e and the L/M chip 2D with the configurations described above are manufactured by a well-known manufacturing method. Thereafter, the process proceeds to a joining step, the junction surfaces of the silicon oxide films 15F and 23aF are polished by a CMP method, and highly flat junction surfaces are formed. Next, similarly to the first and second embodiments described above, joining is performed by plasma activation joining. That is, a plasma activation process is performed on the junction surfaces of the pixel chip 1D and the L/M chip 2D, and the junction surfaces are placed one on another, temporarily joined at normal temperature, and then are rigidly joined by performing an annealing process at 350° C. to 450° C. Thereafter, although not depicted in figures, electrical connections are established between the chips by using a TSV or the like.

Next, as depicted in FIG. 21A, the lens section 1b is formed on the backside 10B of the first semiconductor substrate 10 by a well-known method. Thereby, the stacked chip 3D is formed.

As explained above, because the adhesive 5 is not used for joining the chips, there are no process restrictions arising from the material property of the adhesive 5, and it becomes possible to enhance the process freedom of steps after the joining step. In addition, although this accompanies a high temperature process, nitride films including silicon nitride films for adjusting warping of the chips are not formed on a side of the pixel chip 1D closer to the L/M chip 2D relative to the multilayer wiring layer 12, and on a side of the L/M chip 2D closer to the pixel chip 1D relative to the multilayer wiring layer 23. Accordingly, there is not occurrence of the high temperature steam cross link phenomenon itself, it becomes possible to suppress generation of active hydrogen, and hydrogen desorption from silicon nitride films also is not generated.

Sixth Embodiment

The configuration explained in the fourth embodiment described above corresponds to the configuration of the third embodiment described above, but is different in that direct joining by using the metal electrodes 7 is performed in addition to joining by using the adhesive 5. The configuration of the sixth embodiment corresponds to the configuration of the fourth embodiment, but is different from the configuration of the fourth embodiment described above in that joining is performed without using the adhesive 5.

Hereinafter, constituent sections similar to those in the fourth embodiment described above are given similar reference signs, explanations thereof are omitted as appropriate, and differences are explained in detail.

Figure 22A:
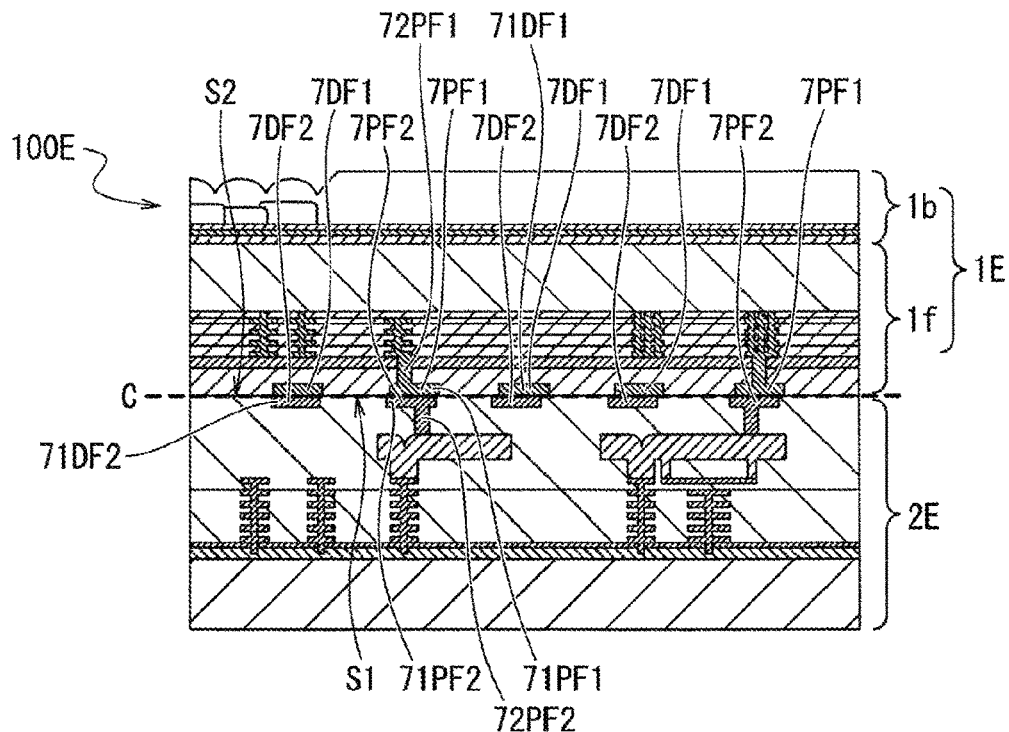
FIG. 22A is a cross-sectional view depicting a configuration example of a solid-state image pickup apparatus according to a sixth embodiment of the present disclosure.

A solid-state image pickup apparatus 100E according to the sixth embodiment includes a pixel chip 1E, and an L/M chip 2E as depicted in FIG. 22A.

The pixel chip 1E according to the sixth embodiment includes a pixel section 1f, and the lens section 1b. The pixel section 1f has a configuration that corresponds to the configuration of the pixel section 1d in the fourth embodiment described above, but is different in that it includes a plurality of metal electrodes 7PF1 and a plurality of dummy electrodes 7DF1, instead of the plurality of metal electrodes 7P1 and the plurality of dummy electrodes 7D1.

Each metal electrode 7PF1 includes a metal electrode pad 71PF1 to function as a joining portion, and a metal electrode via 72P1 that is connected to the multilayer wire 12b. Each dummy electrode 7DF1 includes a metal electrode pad 71DF1 to function as a joining portion. Then, the plurality of metal electrodes 7PF1 and the plurality of dummy electrodes 7DF1 are provided such that pad surfaces (junction surfaces) of the metal electrode pads 71PF1 and 71DF1 are exposed at a junction-side surface of the silicon oxide film 15.

The L/M chip 2E has a configuration that corresponds to the configuration of the L/M chip 2D in the fourth embodiment described above, but is different in that it includes a plurality of metal electrodes 7PF2 and a plurality of dummy electrodes 7DF2 instead of the plurality of metal electrodes 7P2 and the plurality of dummy electrodes 7D2 provided to the silicon oxide film 23a.

Each metal electrode 7PF2 includes a metal electrode pad 71PF2 to function as a joining portion, and a metal electrode via 72P2 that is connected to the multilayer wire 23b. Each dummy electrode 7DF2 includes a metal electrode pad 71DF2 to function as a joining portion. Then, the plurality of metal electrodes 7PF2 and the plurality of dummy electrodes 7DF2 are provided such that pad surfaces (junction surfaces) of the metal electrode pads 71PF2 and 71DF2 are exposed at a junction-side surface of the silicon oxide film 23a.

In the sixth embodiment, the metal electrodes 7PF1 and 7PF2, and the dummy electrodes 7DF1 and 7DF2 are designed such that they become flat without warping at the time of a BEOL step.

Note that the metal electrodes 7PF1 and 7PF2, and the dummy electrodes 7DF1 and 7DF2 include electrically conductive metal materials suited for direct joining. Examples of the metal materials include Cu, Au, Al, and the like, for example. It is assumed in the sixth embodiment that they include Cu.

In addition, the metal electrodes 7PF1 and 7PF2, and the dummy electrodes 7DF1 and 7DF2 form pairs, and a plurality of pairs of these are provided. Furthermore, the metal electrodes 7PF1 and 7PF2, and the dummy electrodes 7DF1 and 7DF2 forming pairs are provided at positions at which pad surfaces thereof at least partially face each other at the time of joining.

In addition, the metal electrodes 7PF1 and 7PF2 are formed by the single damascene method or the dual damascene method, for example, and the dummy electrodes 7DF1 and 7DF2 are formed by the single damascene method, for example.

Hereinafter, in a case that it is not necessary to make distinctions between the metal electrodes 7PF1 and 7PF2, and the dummy electrodes 7DF1 and 7DF2, they are simply referred to as "metal electrodes 7F."

Then, in the sixth embodiment, the end surface of the silicon oxide film 15F which is the first main surface S1 of the pixel chip 1E, and the pad surfaces of the metal electrodes 7PF1 and the dummy electrodes 7DF1, and the end surface of the silicon oxide film 23aF which is the second main surface S2 of the L/M chip 2E and the pad surfaces of the metal electrodes 7PF2 and the dummy electrodes 7DF2 are joined directly. Specifically, ones that form pairs, and face each other in the metal electrodes 7PF1 and the dummy electrodes 7DF1, and the metal electrodes 7PF2 and the dummy electrodes 7DF2 are rigidly joined by direct joining. Furthermore, portions that are between these electrodes and at which the silicon oxide film 15F and the silicon oxide film 23aF face each other are joined directly. Thereby, the stacked chip 3 (hereinafter, referred to as a "stacked chip 3E") according to the sixth embodiment in which the pixel chip 1E and the L/M chip 2E are stacked one on another is configured.

Hereinafter, on the basis of FIGS. 22A, 22B, 22C, and 22D, one example of a method of manufacturing the stacked chip 3E of the sixth embodiment is explained in order of steps.

Figure 22B:
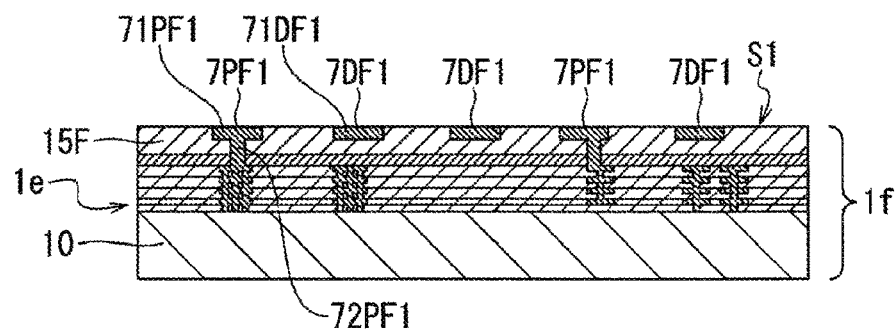
FIG. 22B is a cross-sectional view depicting a method of manufacturing the solid-state image pickup apparatus according to the sixth embodiment of the present disclosure in order of steps.
Figure 22C:
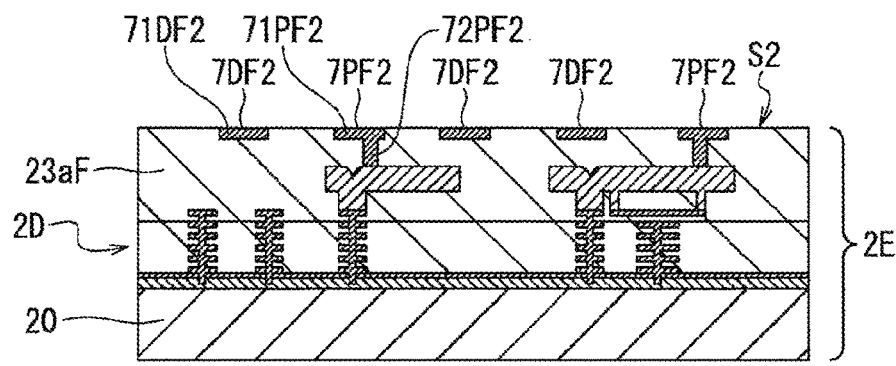
FIG. 22C is a cross-sectional view depicting the method of manufacturing the solid-state image pickup apparatus according to the sixth embodiment in order of steps.
Figure 22D:
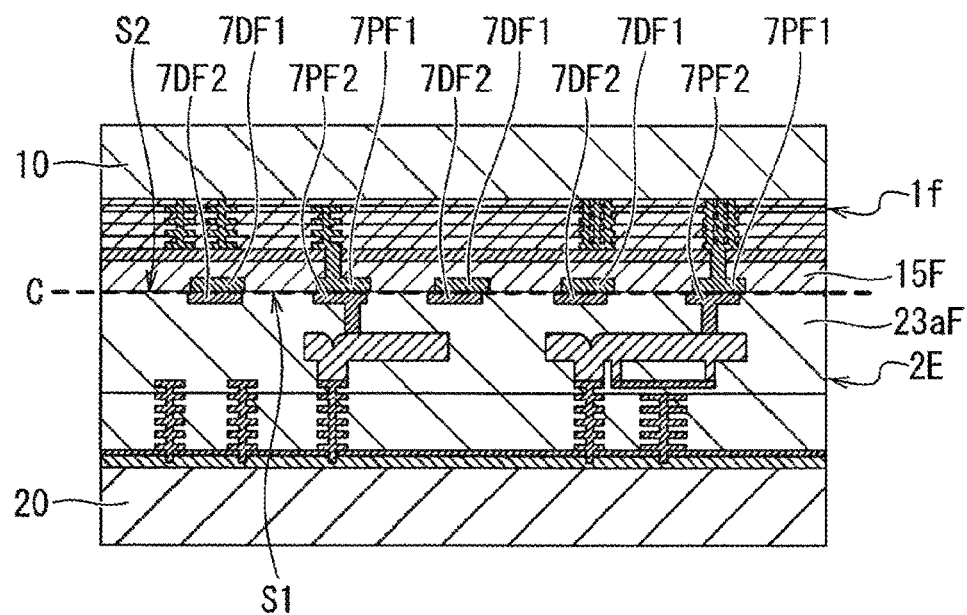
FIG. 22D is a cross-sectional view depicting the method of manufacturing the solid-state image pickup apparatus according to the sixth embodiment in order of steps.

As depicted in FIGS. 22B and 22C, the pixel section 1f and the L/M chip 2E with the configurations described above are manufactured by a well-known manufacturing method. Thereafter, the process proceeds to a joining step, the junction surfaces of the silicon oxide films 15F and 23aF, and the junction surface of the metal electrode 7F are polished by a CMP method, and highly flat junction surfaces are formed. Next, similarly to the first and second embodiments described above, joining is performed by plasma activation joining. That is, a plasma activation process is performed on the junction surfaces of the pixel chip 1E and the L/M chip 2E, and the junction surfaces are placed one on another, temporarily joined at normal temperature, and then are rigidly joined by performing an annealing process at 350° C. to 450° C.

Next, as depicted in FIG. 22A, the lens section 1b is formed on the backside 10B of the first semiconductor substrate 10 by a well-known method. Thereby, the stacked chip 3E is formed.

As explained above, because the adhesive 5 is not used for joining the chips, there are no process restrictions arising from the material property of the adhesive 5, and it becomes possible to enhance the process freedom of steps after the joining step. In addition, although this accompanies a high temperature process, nitride films including silicon nitride films for adjusting warping of the chips are not formed on a side of the pixel chip 1E closer to the L/M chip 2E relative to the multilayer wiring layer 12, and on a side of the L/M chip 2E closer to the pixel chip 1E relative to the multilayer wiring layer 23. Accordingly, there is not occurrence of the high temperature steam cross link phenomenon itself, it becomes possible to suppress generation of active hydrogen, and hydrogen desorption from silicon nitride films also is not generated.

<Examples of Application to Electronic Equipment>

The technology according to the present disclosure (the present technology) can be applied to various products. For example, the technology according to the present disclosure can be applied to various types of electronic equipment like image pickup apparatuses such as a digital still camera or a digital video camera, mobile phones having an image pickup function, or other equipment having an image pickup function.

Figure 23:
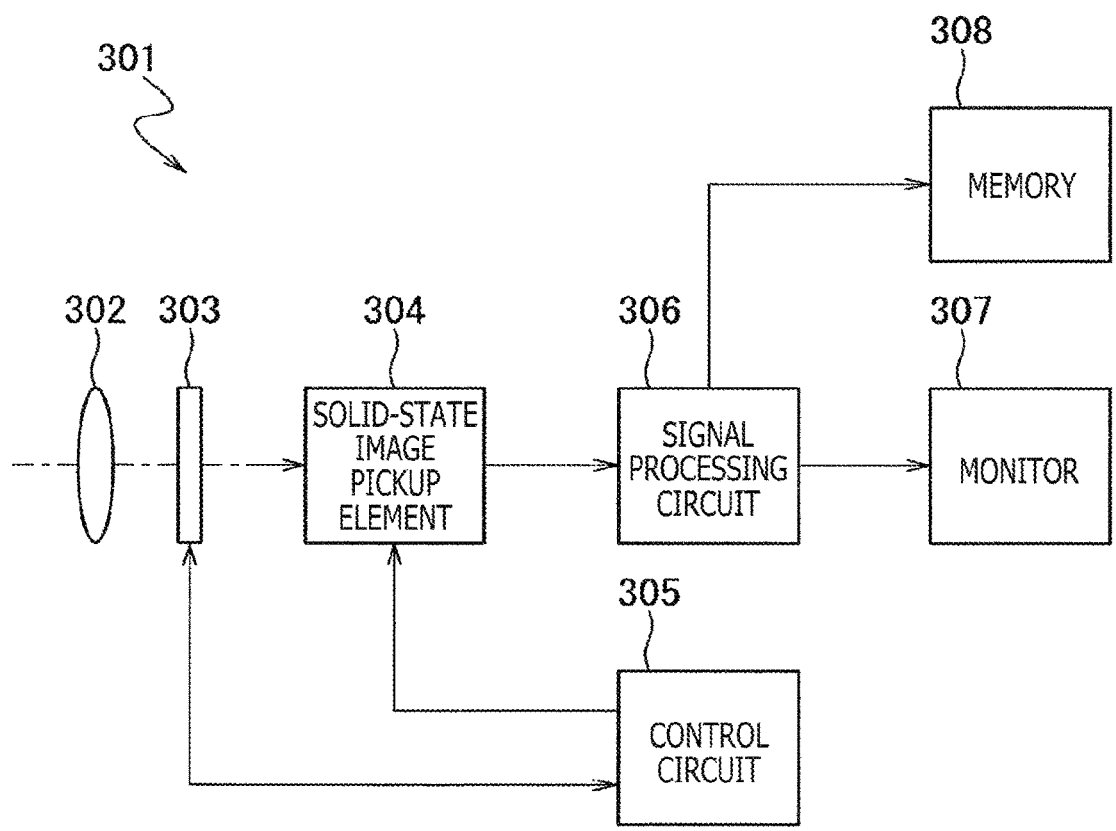
FIG. 23 is a block diagram depicting a configuration example of an image pickup apparatus as electronic equipment.

FIG. 23 is a block diagram depicting a configuration example of an image pickup apparatus as electronic equipment to which the present technology can be applied. An image pickup apparatus 301 depicted in FIG. 23 includes an optical system 302, a shutter apparatus 303, a solid-state image pickup element 304, a control circuit 305, a signal processing circuit 306, a monitor 307, and a non-volatile memory 308, and can capture still images and moving images.

The optical system 302 includes one lens or a plurality of lenses, guides light from a subject (incident light) to the solid-state image pickup element 304, and causes an image to be formed on the light-receiving surface of the solid-state image pickup element 304.

The shutter apparatus 303 is arranged between the optical system 302 and the solid-state image pickup element 304, and, under the control of the control circuit 305, controls the light emission period, and light blocking period of light heading toward the solid-state image pickup element 304.

The solid-state image pickup element 304 accumulates signal charge for a predetermined period according to light to form an image on the light-receiving surface after going through the optical system 302 and the shutter apparatus 303. The signal charge accumulated in the solid-state image pickup element 304 is transferred according to a drive signal (timing signal) supplied from the control circuit 305.

The control circuit 305 outputs drive signals to control the transfer operation of the solid-state image pickup element 304, and the shutter operation of the shutter apparatus 303, and drives the solid-state image pickup element 304, and the shutter apparatus 303.

The signal processing circuit 306 performs various types of signal processing on signal charge output from the solid-state image pickup element 304. An image (image data) obtained by the signal processing performed by the signal processing circuit 306 is supplied to, and displayed on the monitor 307, is supplied to, and stored (recorded) on the non-volatile memory 308, for example.

In the thus-configured image pickup apparatus 301 also, by applying the solid-state image pickup apparatuses 100, and 100A to 100E instead of the solid-state image pickup element 304 mentioned above, it becomes possible to realize an image pickup apparatus that can reduce deterioration of memories due to active hydrogen or the like.

Other Embodiments

Although the present disclosure has been described according to embodiments, and modification examples as described above, it should not be understood that statements and figures forming part of the disclosure are to limit the present disclosure. For those skilled in the art, various alternative embodiments, examples, and operation technologies would be apparent from this disclosure.

For example, in the present embodiment, the memory section 210 does not necessarily have to include a magneto-resistive random access memory. For example, if conditions related to heat-resistant property or the like are satisfied, it may include a ferroelectric memory, a phase change memory, a resistive random access memory, or the like mentioned above.

In addition, in the present embodiment, the configuration in which protective films including hydrogen storage metals are provided on the top surfaces and side surfaces of MTJ elements 8 is not the sole example. For example, protective films may be provided also on the lower surfaces, in addition to the top surfaces and side surfaces.

In this manner, certainly, the present disclosure includes various embodiments and the like not described here. Within the scope not deviating from the gist of the embodiments and modification examples mentioned above, at least one of various types of omission, replacement, and modification of constituent elements can be performed. In addition, advantages described in the present specification are merely illustrated as examples, the advantages of the present disclosure are not limited to them, and there may be other advantages. The technical scope of the present disclosure is defined only by invention specifying matters according to claims that are reasonably deducible from the explanation described above.

Note that the present disclosure can also have configurations like the ones mentioned below.

(1) A solid-state image pickup apparatus including:
- a first structure having a first substrate, and a pixel region including a plurality of pixels which is formed in the first substrate, outputs pixel signals according to amounts of electric charges generated by photoelectric conversion, and is arrayed in a two-dimensional grid; and
- a second structure which is stacked on the first structure, and has a second substrate, and a logic circuit and a non-volatile memory that are formed in the second substrate, in which
- a first protective film having a property of inhibiting entrance of hydrogen is formed on an end surface of a storage element included in the non-volatile memory which end surface is on a side facing the first structure, and
- a second protective film having the property of inhibiting entrance of hydrogen is formed on a side surface of the storage element.

(2) The solid-state image pickup apparatus according to (1), in which
- the non-volatile memory includes a magneto-resistive random access memory having a magnetic tunnel junction element as the storage element, a selection transistor, and an electrode section connecting one of diffusion regions of the selection transistor and the magnetic tunnel junction element.

(3) The solid-state image pickup apparatus according to (1) or (2), in which
- the first protective film includes a metal film including a metal having a function of storing hydrogen, and is formed on an electrode section forming the end surface of the magnetic tunnel junction element.

(4) The solid-state image pickup apparatus according to (3), in which
- the first protective film includes a metal film including, as the metal having the function of storing hydrogen, one type or a plurality of types of metal selected from titanium, magnesium, nickel, palladium, vanadium, manganese, zirconium, and iridium.

(5) The solid-state image pickup apparatus according to any one of (1) to (4), in which
- the first protective film is formed such that the first protective film surrounds the end surface entirely in a plan view only to such an extent that the first protective film does not short-circuit with another adjacent element.

(6) The solid-state image pickup apparatus according to any one of (1) to (4), in which
- the second protective film includes a metal film including a metal having a function of storing hydrogen, and is formed on a side surface of the storage element via an insulating film.

(7) The solid-state image pickup apparatus according to (6), in which
- the second protective film includes a metal film including, as the metal having the function of storing hydrogen, one type or a plurality of types of metal selected from titanium, magnesium, nickel, palladium, vanadium, manganese, zirconium, and iridium.

(8) The solid-state image pickup apparatus according to any one of (1) to (5), in which
- the first structure has a plurality of transistors that is included in the pixel region, a first wiring layer, and an interlayer dielectric film for joining, the plurality of transistors and the first wiring layer being formed on a a first main surface side of the first structure which is one surface of the first structure, the interlayer dielectric film being formed on a layer above the plurality of transistors and the first wiring layer,
- the second structure has the logic circuit, the non-volatile memory, a second wiring layer, and an interlayer dielectric film for joining, the logic circuit, the non-volatile memory, and the second wiring layer being formed on a second main surface side of the second structure which is one surface of the second structure, the interlayer dielectric film being formed on a layer above the logic circuit, the non-volatile memory, and the second wiring layer, and
- the first structure and the second structure are stacked one on another by joining the interlayer dielectric films that are formed on the first main surface side and on the second main surface side.

(9) The solid-state image pickup apparatus according to (8), in which
- the interlayer dielectric films are joined via an adhesive including a resin material.

(10) The solid-state image pickup apparatus according to (9), in which
- the adhesive includes at least one type of resin selected from a BCB (Benzocyclobutene) resin, a Polyimide resin, a Benzoxazole resin, and a Polyarylene resin.

(11) The solid-state image pickup apparatus according to any one of (8) to (10), in which
- the first wiring layer of the first structure and the second wiring layer of the second structure are electrically connected via a through silicon electrode.

(12) The solid-state image pickup apparatus according to any one of (8) to (11), in which,
- as an interlayer dielectric film, only an oxide film is formed on at least one of a side of the first structure closer to the second structure relative to the first wiring layer, and a side of the second structure closer to the first structure relative to the second wiring layer.

(13) The solid-state image pickup apparatus according to (8), in which
- a plurality of metal electrodes is provided at opposite positions at junction surface portions of the respective interlayer dielectric films of the first structure, and the second structure, and
- each pair of the metal electrode of the first structure and the metal electrode of the second structure that face each other are joined directly, and the interlayer dielectric films are joined via an adhesive.

(14) The solid-state image pickup apparatus according to (13), in which
a plurality of the metal electrodes includes a metal electrode for connection for electrically connecting the first structure, and the second structure, and a dummy metal electrode including only a metal electrode pad.

(15) The solid-state image pickup apparatus according to (13) or (14), in which
one of or each of the pair of the metal electrode of the first structure and the metal electrode of the second structure that face each other has a tip section with a protruding shape.

(16) The solid-state image pickup apparatus according to any one of (13) to (15), in which,
as the interlayer dielectric film, only an oxide film is formed on at least one of a side of the first structure closer to the second structure relative to the first wiring layer, and a side of the second structure closer to the first structure relative to the second wiring layer.

(17) The solid-state image pickup apparatus according to any one of (13) to (16), in which
the adhesive includes at least one type of resin selected from a BCB (Benzocyclobutene) resin, a Polyimide resin, a Benzoxazole resin, and a Polyarylene resin.

(18) The solid-state image pickup apparatus according to (8), in which
a plurality of metal electrodes is provided at opposite positions at junction surface portions of the interlayer dielectric films of the first structure and the second structure, and
each pair of the metal electrode of the first structure and the metal electrode of the second structure that face each other are joined directly, and the interlayer dielectric films are joined directly.

(19) A solid-state image pickup apparatus manufacturing method including:
a step of configuring a first structure by forming a pixel region in a first substrate, the pixel region having a plurality of pixels that is arrayed in a two-dimensional grid;
a step of configuring a second structure by forming a logic circuit and a non-volatile memory in a second substrate; and
a step of stacking the first structure, and the second structure one on another, in which
in the step of configuring the second structure, a second protective film having a property of inhibiting entrance of hydrogen is formed on a side surface of a storage element included in the non-volatile memory, and then a first protective film having the property of inhibiting entrance of hydrogen is formed on an end surface of the storage element which end surface is on a side to face the first structure.

(20) Electronic equipment including
a solid-state image pickup apparatus including
a first structure having a first substrate, and a pixel region including a plurality of pixels which is formed in the first substrate, outputs pixel signals according to amounts of electric charges generated by photoelectric conversion, and is arrayed in a two-dimensional grid, and
a second structure that is stacked on the first structure, and has a second substrate, and a logic circuit and a non-volatile memory that are formed in the second substrate, in which
a first protective film having a property of inhibiting entrance of hydrogen is formed on an end surface of a storage element included in the non-volatile memory which end surface is on a side facing the first structure, and
a second protective film having the property of inhibiting entrance of hydrogen is formed on a side surface of the storage element.

REFERENCE SIGNS LIST 1, 1A, 1C, 1D, 1E: Pixel chip
1a, 1d, 1e, 1f: Pixel section
1b: Lens section
2, 2A, 2C, 2D, 2E: Logic memory chip
3, 3A, 3B, 3C, 3D, 3E: Stacked chip
4T, 4T': Upper protective film
4S, 4S1, 4S2: Side protective film
5: Adhesive
6A: Twin-contact type TSV
6B: Shared-contact type TSV
7P1, 7PF1, 7P2, 7PF2: Metal electrode
7D1, 7DF1, 7D2, 7DF2: Dummy electrode
8: Storage element
10A, 20A: Front surface
10B, 20B: Backside
11, 21: Well region
12a, 13 to 15, 23a, 25, 26, 220, 221, 230, 231: Interlayer dielectric film
12, 23: Multilayer wiring layer
12b, 23b: Multilayer wire
14, 25: Silicon nitride film
15, 15F, 23a, 23aF, 26, 40: Silicon oxide film
16: Flattening layer
17: Color filter layer
18: Microlens
22: Logic memory mixed layer
81: Free layer
82: Tunnel barrier layer
83: Pinned layer
84: Upper electrode
85: Lower electrode
71C, 71P1, 71PF1, 71P2, 71PF2, 71D1, 71DF1, 71DF2: Metal electrode pad
72P1, 72P2: Metal electrode via
100, 100A to 100E: Solid-state image pickup apparatus
200: Logic circuit section
201: MOS transistor
201G, 211G: Gate electrode
202, 203, 212: Contact
204, 205, 214, 215: Metal wire
210: Memory section
211, Tr_sel: Selection transistor
211S: Source region
213: Conductive via
301: Image pickup apparatus
302: Optical system
303: Shutter apparatus
304: Solid-state image pickup element
305: Control circuit
306: Signal processing circuit
307: Monitor
308: Non-volatile memory
B1: First back surface
B2: Second back surface
C, C1, C2: Joining portion
FD: Floating diffusion region
PD: Photodiode
S1: First main surface S2: Second main surface
Tr_amp: Amplification transistor
Tr_res: Reset transistor
Tr_tra: Transfer transistor

The invention claimed is:

1. A solid-state image pickup apparatus, comprising:
a first structure that includes:
  a first substrate; and
  a pixel region that includes a plurality of pixels, wherein
    the plurality of pixels is in the first substrate,
    each pixel of the plurality of pixels is configured to:
      generate an amount of an electric charge based on photoelectric conversion; and
      output a pixel signal based on the generated amount of the electric charge, and
    the plurality of pixels is in a two-dimensional grid arrangement; and
a second structure on the first structure, wherein the second structure includes:
  a second substrate;
  a logic circuit in the second substrate;
  a non-volatile memory in the second substrate, wherein
    the non-volatile memory includes a magneto-resistive random access memory, and
    the magneto-resistive random access memory includes:
      a magnetic tunnel junction element as a first storage element;
      a selection transistor that includes a plurality of diffusion regions; and
      a first electrode section configured to connect a diffusion region of the plurality of diffusion regions to the magnetic tunnel junction element;
    a first protective film on an end surface of the first storage element, wherein
      the end surface of the first storage element faces the first structure, and
      the first protective film is configured to inhibit an entrance of hydrogen; and
    a second protective film on a side surface of the first storage element, wherein the second protective film is configured to inhibit the entrance of the hydrogen.

2. The solid-state image pickup apparatus according to claim 1, wherein
the first storage element includes a second electrode section,
in a plan view,
  the first protective film encircles an end surface of the second electrode section, and
  the first protective film surrounds the end surface of the second electrode section to an extent that the first protective film prevents a short-circuit with a second storage element, and
the second storage element is adjacent to the first storage element.

3. The solid-state image pickup apparatus according to claim 1, wherein
the first protective film includes a metal film,
the metal film includes a metal,
the metal is configured to store the hydrogen,
the first storage element includes a second electrode section,
an end surface of the second electrode section is the end surface of the first storage element, and
the first protective film is on the end surface of the second electrode section.

4. The solid-state image pickup apparatus according to claim 3, wherein the metal film includes, as the metal, at least one of titanium, magnesium, nickel, palladium, vanadium, manganese, zirconium, or iridium.

5. The solid-state image pickup apparatus according to claim 1, wherein
the second protective film includes a metal film,
the metal film includes a metal,
the metal is configured to store the hydrogen, and
the metal film is on the side surface of the first storage element via an insulating film.

6. The solid-state image pickup apparatus according to claim 5, wherein the metal film includes, as the metal, at least one of titanium, magnesium, nickel, palladium, vanadium, manganese, zirconium, or iridium.

7. The solid-state image pickup apparatus according to claim 1, wherein
the first structure further includes:
  a plurality of transistors in the pixel region;
  a first wiring layer on a main surface side of the first structure; and
  a first interlayer dielectric film that joins the plurality of transistors and the first wiring layer, wherein the first interlayer dielectric film is on a layer that is above each of the first wiring layer and the plurality of transistors,
the second structure further includes:
  a second wiring layer on a main surface side of the second structure; and
  a second interlayer dielectric film that joins each of:
    the logic circuit,
    the non-volatile memory, and
    the second wiring layer,
  the second interlayer dielectric film is on a layer above each of:
    the logic circuit,
    the non-volatile memory, and
    the second wiring layer, and
the first structure is on the second structure based on a joint between the first interlayer dielectric film and the second interlayer dielectric film.

8. The solid-state image pickup apparatus according to claim 7, wherein the first wiring layer of the first structure and the second wiring layer of the second structure are electrically connected via a through silicon electrode.

9. The solid-state image pickup apparatus according to claim 7, wherein
at least one of the first interlayer dielectric film or the second interlayer dielectric film includes an oxide film,
the oxide film is on at least one of:
  a first side of the first structure, or
  a second side of the second structure,
the first side of the first structure is closer to the second structure with respect to the first wiring layer, and
the second side of the second structure is closer to the first structure with respect relative to the second wiring layer.

10. The solid-state image pickup apparatus according to claim 7, wherein
a plurality of metal electrodes is provided at opposite positions at junction surface portions of the first interlayer dielectric film of the first structure and the second interlayer dielectric film of the second structure, and
each pair of a metal electrode of the plurality of metal electrodes of the first structure and a metal electrode of the plurality of metal electrodes of the second structure that face each other are joined directly, and the first interlayer dielectric film and the second interlayer dielectric film are joined directly.

11. The solid-state image pickup apparatus according to claim 7, further comprising an adhesive that includes a resin material, wherein the adhesive joins the first interlayer dielectric film with the second interlayer dielectric film.

12. The solid-state image pickup apparatus according to claim 11, wherein the adhesive further includes at least one of a BCB (Benzocyclobutene) resin, a Polyimide resin, a Benzoxazole resin, or a Polyarylene resin.

13. The solid-state image pickup apparatus according to claim 7, wherein
a plurality of metal electrodes is provided at opposite positions at junction surface portions of the first interlayer dielectric film of the first structure, and the second interlayer dielectric film of the second structure, respectively, and
each pair of a metal electrode of the plurality of metal electrodes of the first structure and a metal electrode of the plurality of metal electrodes of the second structure that face each other are joined directly, and the first interlayer dielectric film and the second interlayer dielectric film are joined via an adhesive.

14. The solid-state image pickup apparatus according to claim 13, wherein a plurality of the metal electrodes includes a metal electrode for connection for electrically connecting the first structure, and the second structure, and a dummy metal electrode including only a metal electrode pad.

15. The solid-state image pickup apparatus according to claim 13, wherein one of or each of the pair of the metal electrode of the first structure and the metal electrode of the second structure that face each other has a tip section with a protruding shape.

16. The solid-state image pickup apparatus according to claim 13, wherein, as at least one of the first interlayer dielectric film or the second interlayer dielectric film, only an oxide film is formed on at least one of a side of the first structure closer to the second structure relative to the first wiring layer, and a side of the second structure closer to the first structure relative to the second wiring layer.

17. The solid-state image pickup apparatus according to claim 13, wherein the adhesive includes at least one type of resin selected from a BCB (Benzocyclobutene) resin, a Polyimide resin, a Benzoxazole resin, and a Polyarylene resin.

18. A solid-state image pickup apparatus manufacturing method, comprising:
configuring a first structure, wherein the configuring of the first structure includes:
forming a first substrate; and
forming a pixel region in the first substrate, wherein the pixel region includes a plurality of pixels that is in a two-dimensional grid arrangement;
configuring a second structure, wherein configuring the second structure includes:
forming a second substrate;
forming a logic circuit in the second substrate;
forming a non-volatile memory in the second substrate, wherein
the non-volatile memory includes a magneto-resistive random access memory, and
the magneto-resistive random access memory includes:
a magnetic tunnel junction element as a storage element;
a selection transistor including a plurality of diffusion regions; and
an electrode section that connects a diffusion region of the plurality of diffusion regions to the magnetic tunnel junction element;
forming a first protective film, having a property of inhibiting entrance of hydrogen, on an end surface of the storage element, wherein the end surface of the storage element faces the first structure; and
forming a second protective film, having the property of the inhibiting entrance of the hydrogen, on a side surface of the storage element; and
stacking the first structure on the second structure.

19. Electronic equipment, comprising:
a solid-state image pickup apparatus including:
a first structure that includes:
a first substrate; and
a pixel region including a plurality of pixels, wherein
the plurality of pixels is in the first substrate,
each pixel of the plurality of pixels is configured to:
generate an amount of an electric charge based on photoelectric conversion; and
output a pixel signal based on the generated amount of the electric charge, and
the plurality of pixels is in a two-dimensional grid arrangement; and
a second structure on the first structure, wherein the second structure includes:
a second substrate;
a logic circuit in the second substrate; and
a non-volatile memory in the second substrate, wherein
the non-volatile memory includes a magneto-resistive random access memory, and
the magneto-resistive random access memory includes:
a magnetic tunnel junction element as a storage element;
a selection transistor that includes a plurality of diffusion regions; and
an electrode section configured to connect a diffusion region of the plurality of diffusion regions to the magnetic tunnel junction element;
a first protective film on an end surface of the storage element, wherein
the end surface of the storage element faces the first structure, and
the first protective film is configured to inhibit an entrance of hydrogen; and
a second protective film on a side surface of the storage element, wherein the second protective film is configured to inhibit the entrance of the hydrogen.

20. A solid-state image pickup apparatus, comprising:
a first structure that includes:
a first substrate; and
a pixel region that includes a plurality of pixels, wherein
the plurality of pixels is in the first substrate,
each pixel of the plurality of pixels is configured to:
generate an amount of an electric charge based on photoelectric conversion; and
output a pixel signal based on the generated amount of the electric charge, and the plurality of pixels is in a two-dimensional grid arrangement; and a second structure on the first structure, wherein the second structure includes:
a second substrate;
a logic circuit in the second substrate;
a non-volatile memory in the second substrate, wherein the non-volatile memory includes:
a first storage element; and
an electrode section;
a first protective film on an end surface of the first storage element, wherein
the end surface of the storage element faces the first structure,
the first protective film is configured to inhibit an entrance of hydrogen,
in a plan view,
the first protective film encircles an end surface of the electrode section, and
the first protective film surrounds the end surface of the electrode section to an extent that the first protective film prevents a short-circuit with a second storage element, and
the second storage element is adjacent to the first storage element; and
a second protective film on a side surface of the first storage element, wherein the second protective film is configured to inhibit the entrance of the hydrogen.

\* \* \* \* \*